(12) United States Patent
Cho et al.

(10) Patent No.: US 11,943,926 B2
(45) Date of Patent: Mar. 26, 2024

(54) SEMICONDUCTOR DEVICE AND DATA STORAGE SYSTEM INCLUDING THE SAME

(71) Applicant: Samsung Electronics Co., Ltd., Suwon-si (KR)

(72) Inventors: Wonseok Cho, Suwon-si (KR); Seulbi Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 196 days.

(21) Appl. No.: 17/377,869

(22) Filed: Jul. 16, 2021

(65) Prior Publication Data

US 2022/0115397 A1    Apr. 14, 2022

(30) Foreign Application Priority Data

Oct. 8, 2020 (KR) .......................... 10-2020-0130128

(51) Int. Cl.

| | |
|---|---|
| *H10B 43/30* | (2023.01) |
| *H01L 21/762* | (2006.01) |
| *H01L 25/065* | (2023.01) |
| *H01L 25/18* | (2023.01) |
| *H10B 41/27* | (2023.01) |
| *H10B 43/27* | (2023.01) |
| *H01L 23/00* | (2006.01) |

(52) U.S. Cl.
CPC ....... *H10B 43/27* (2023.02); *H01L 21/76232* (2013.01); *H01L 25/0657* (2013.01); *H01L 25/18* (2013.01); *H10B 41/27* (2023.02); *H01L 24/08* (2013.01); *H01L 2224/08145* (2013.01)

(58) Field of Classification Search
None
See application file for complete search history.

(56) References Cited

U.S. PATENT DOCUMENTS 9,754,959 B2    9/2017  Yun et al.
2003/0230786 A1  12/2003  Kim et al.
(Continued)

FOREIGN PATENT DOCUMENTS

KR    10-1994-0010333         5/1994
KR    10-1998-0021363 A       6/1998
(Continued)

*Primary Examiner* — Sarah K Salerno
(74) *Attorney, Agent, or Firm* — Harness, Dickey & Pierce, P.L.C.

(57) ABSTRACT

A semiconductor device including a substrate; a horizontal conductive layer disposed on the substrate; a support layer disposed on the horizontal conductive layer; a stack structure including a plurality of gate electrodes, stacked to be spaced apart from each other in a direction perpendicular to an upper surface of the support layer, and a plurality of interlayer insulating layers stacked alternately with the plurality of gate electrodes; a channel structure penetrating through the stack structure; a separation structure penetrating through the horizontal conductive layer, the support layer, and the stack structure and extending in a first direction; and a conductive pattern disposed on a level between the horizontal conductive layer and a lowermost interlayer insulating layer, among the plurality of interlayer insulating layers, and protruding outwardly of the separation structure from a side surface of the separation structure.

20 Claims, 28 Drawing Sheets

(56) References Cited

U.S. PATENT DOCUMENTS

| | | | |
|---|---|---|---|
| 2004/0164328 A1 | 8/2004 | Lee et al. | |
| 2005/0162958 A1 | 7/2005 | Chae et al. | |
| 2005/0173753 A1 | 8/2005 | Kim et al. | |
| 2015/0372000 A1* | 12/2015 | Jee | H01L 29/792 257/314 |
| 2018/0337140 A1 | 11/2018 | Luoh et al. | |
| 2018/0366483 A1* | 12/2018 | Choi | H10B 41/47 |
| 2019/0326315 A1 | 10/2019 | Lee et al. | |
| 2020/0119038 A1 | 4/2020 | Hopkins et al. | |
| 2020/0350168 A1* | 11/2020 | Kim | H01L 21/82 |

FOREIGN PATENT DOCUMENTS

| | | |
|---|---|---|
| KR | 10-2003-0027378 A | 4/2003 |
| KR | 10-2003-0096463 A | 12/2003 |
| KR | 10-2004-0076016 A | 8/2004 |
| KR | 10-2005-0040534 A | 5/2005 |
| KR | 10-2005-0079561 A | 8/2005 |

\* cited by examiner

SEMICONDUCTOR DEVICE AND DATA STORAGE SYSTEM INCLUDING THE SAME

CROSS-REFERENCE TO RELATED APPLICATION

This application claims benefit of priority to Korean Patent Application No. 10-2020-0130128 filed on Oct. 8, 2020 in the Korean Intellectual Property Office, the disclosure of which is incorporated herein by reference in its entirety.

BACKGROUND

The present disclosure relates to semiconductor devices and data storage systems including the same.

In an electronic system required to store data, a semiconductor device capable of storing high-capacity data is demanded. Accordingly, research into a method of increasing data storage capacity of a semiconductor device is ongoing. For example, a semiconductor device including three-dimensionally arranged memory cells, rather than two-dimensionally arranged memory cells, has been proposed as a method of increasing data storage capacity of a semiconductor device.

SUMMARY

Example embodiments provide a semiconductor device having improved reliability.

Example embodiments provide a data storage system including a semiconductor device having improved reliability.

According to some example embodiments, a semiconductor device includes a peripheral circuit structure including a first substrate and circuit elements on the first substrate; a second substrate disposed on the peripheral circuit structure; a first horizontal conductive layer disposed on the second substrate; a second horizontal conductive layer disposed on the first horizontal conductive layer; a stack structure including a plurality of gate electrodes, stacked to be spaced apart from each other in a direction perpendicular to an upper surface of the second horizontal conductive layer, and a plurality of interlayer insulating layers stacked alternately with the plurality of gate electrodes; a channel structure including a channel layer and penetrating through the first horizontal conductive layer, the second horizontal conductive layer, and the stack structure; and a separation insulating layer penetrating through the first horizontal conductive layer, the second horizontal conductive layer, and the stack structure and extending in a first direction. The separation insulating layer includes a first portion having a continuously decreased width, and a second portion penetrating through the first and second horizontal conductive layers and having a width greater than a minimum width of the first portion.

According to some example embodiments, a semiconductor device includes a substrate; a horizontal conductive layer disposed on the substrate; a support layer disposed on the horizontal conductive layer; a stack structure including a plurality of gate electrodes, stacked to be spaced apart from each other in a direction perpendicular to an upper surface of the support layer, and a plurality of interlayer insulating layers stacked alternately with the plurality of gate electrodes; a channel structure penetrating through the stack structure; a separation structure penetrating through the horizontal conductive layer, the support layer, and the stack structure and extending in a first direction; and a conductive pattern disposed on a level between the horizontal conductive layer and a lowermost interlayer insulating layer, among the plurality of interlayer insulating layers, and protruding outwardly of the separation structure from a side surface of the separation structure.

According to some example embodiments, a data storage system includes a semiconductor storage device including a first substrate, circuit elements on the first substrate, a second substrate disposed on the circuit elements, a horizontal conductive layer disposed on the second substrate, a support layer disposed on the horizontal conductive layer, a stack structure including a plurality of gate electrodes, stacked to be spaced apart from each other in a direction perpendicular to an upper surface of the support layer, and a plurality of interlayer insulating layers, stacked alternately with the plurality of gate electrodes, a channel structure penetrating through the stack structure, a separation structure penetrating through the horizontal conductive layer, the support layer, and the stack structure and extending in a first direction, a conductive pattern disposed on a level between the horizontal conductive layer and a lowermost interlayer insulating layer, among the plurality of interlayer insulating layers, and protruding outwardly of the separation structure from a side surface of the separation structure, and an input/output pad electrically connected to the circuit element; and a controller electrically connected to the semiconductor storage device through the input/output pad and configured to control the semiconductor storage device.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
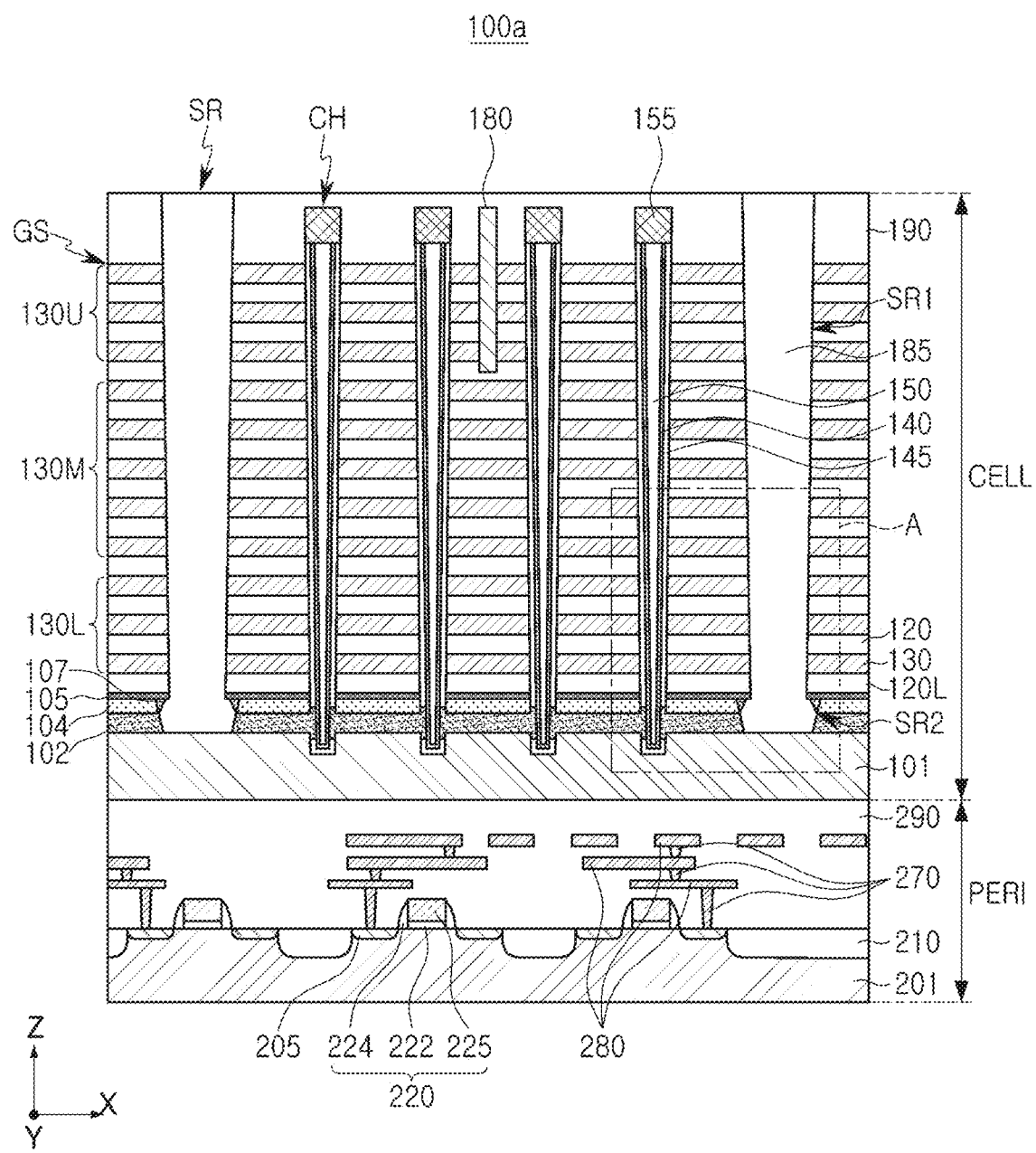
FIG. 1 is a schematic cross-sectional view of a semiconductor device according to example embodiments.
Figure 2:
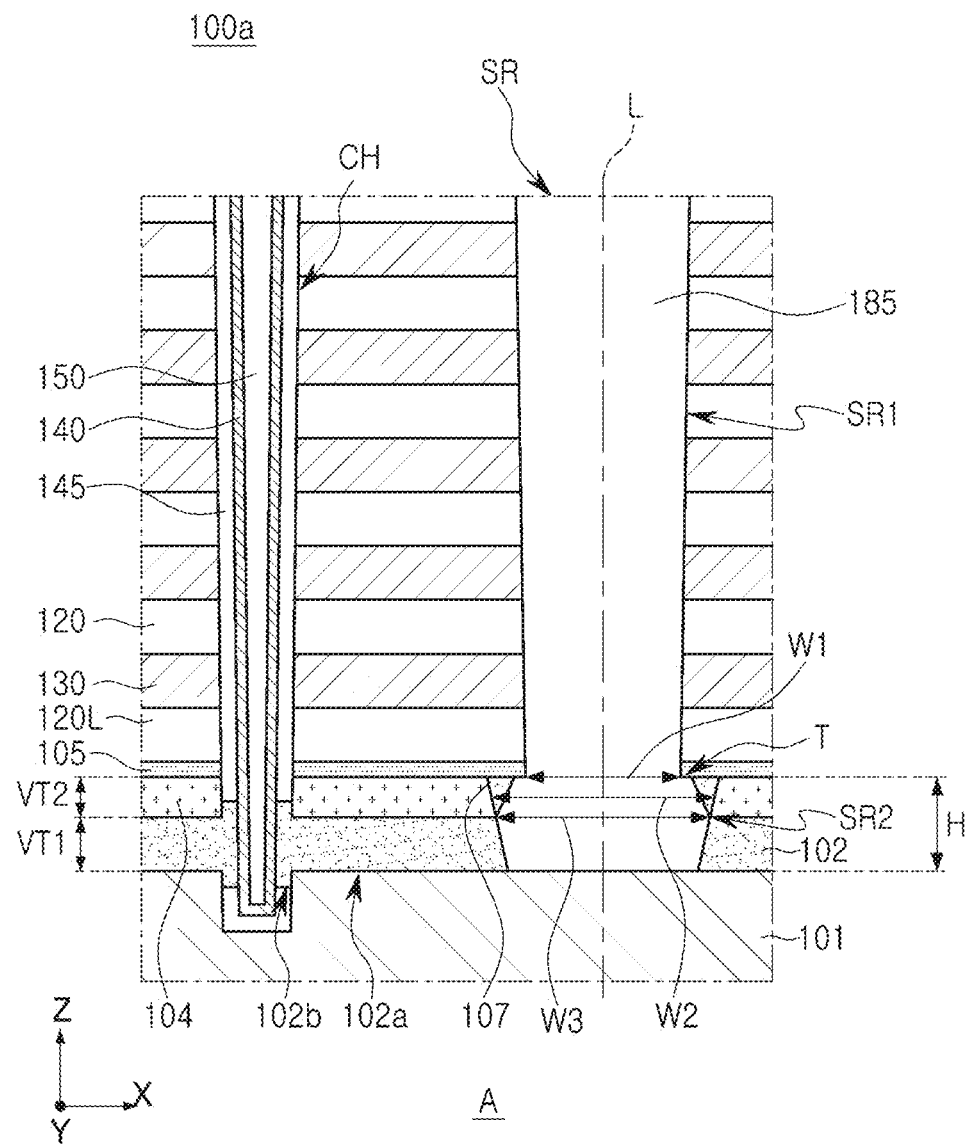
FIG. 2 is an enlarged view of a semiconductor device according to example embodiments.

FIG. 1 is a schematic cross-sectional view of a semiconductor device according to example embodiments. FIG. 2 is an enlarged view of a semiconductor device according to example embodiments. FIG. 2 is an enlarged view of region "A" of FIG. 1.

Referring to FIGS. 1 and 2, a semiconductor device 100a may include a peripheral circuit structure PERI, including a first substrate 201, and a memory cell structure CELL including a second substrate 101. The memory cell structure CELL may be disposed above the peripheral circuit structure PERI. In contrast, in some other example embodiments, the memory cell structure CELL may be disposed below the peripheral circuit structure PERI.

The peripheral circuit structure PERI may include the first substrate 201, source/drain regions 205 and the device isolation layers 210 in the first substrate 201, and circuit elements 220, circuit contact plugs 270, circuit interconnection lines 280, and a peripheral insulating layer 290 disposed on the first substrate 201.

The first substrate 201 may have an upper surface extending in an X direction and a Y direction. An active region may be defined in the first substrate 201 by the device isolation layers 210. Source/drain regions 205, including impurities, may be disposed in a portion of the active region. The first substrate 201 may include a semiconductor material such as a group IV semiconductor, a group III-V compound semiconductor, and/or a group II-VI compound semiconductor. The first substrate 201 may be provided as a bulk wafer or an epitaxial layer.

The circuit elements 220 may include a planar transistor. Each of the circuit elements 220 may include a circuit gate dielectric layer 222, a spacer layer 224, and a circuit gate electrode 225. Source/drain regions 205 may be disposed in the first substrate 201 on opposite sides of the circuit gate electrode 225.

The peripheral insulating layer 290 may be disposed on the circuit element 220 on the first substrate 201. Circuit contact plugs 270 may penetrate through the peripheral insulating layer 290 to be connected to the source/drain regions 205. An electrical signal may be applied to the circuit element 220 by the circuit contact plugs 270. In a region, not illustrated, the circuit contact plugs 270 may also be connected to the circuit gate electrode 225. The circuit interconnection lines 280 may be connected to the circuit contact plugs 270 and may be disposed as a plurality of layers.

The memory cell structure CELL may include a second substrate 101, a first horizontal conductive layer 102 disposed on the second substrate 101, a second horizontal conductive layer 104 disposed on the first horizontal conductive layer 104, a stack structure GS, a channel structure CH, and a separation structure SR. The stack structure GS may include a plurality of gate electrodes 130 stacked to be spaced apart from each other in a direction, perpendicular to an upper surface of the second horizontal conductive layer 104, and a plurality of interlayer insulating layers 120 stacked alternately with the plurality of gate electrodes. The channel structure CH may penetrate through the stack structure GS, and the separation structure SR may penetrate through the stack structure GS and may extend in a length direction. The memory cell structure CELL may further include a first conductive pattern 107 protruding outwardly of the separation structure SR from a side surface of the separation structure SR. In example embodiments, the memory cell structure CELL may further include a third horizontal conductive layer 105 disposed on the second horizontal conductive layer 104.

The second substrate 101 may have an upper surface extending in the X direction and the Y directions. The second substrate 101 may include a semiconductor material such as a group IV semiconductor, a group III-V compound semiconductor, and/or a group II-VI compound semiconductor. For example, the group IV semiconductor may include silicon, germanium, and/or silicon-germanium. The second substrate 101 may further include impurities. The second substrate 101 may be provided as a polycrystalline semiconductor layer, such as a polycrystalline silicon layer, or an epitaxial layer.

The first horizontal conductive layer 102 may be stacked on an upper surface of the second substrate 101 to be in contact with the second substrate 101. At least a portion of the first horizontal conductive layer 102 may function as a portion of a common source line of the semiconductor device 100a. For example, the horizontal conductive layer 102 may function as a common source line together with the second substrate 101.

As illustrated in FIG. 2, the first horizontal conductive layer 102 may include a horizontal portion 102a, disposed between the second substrate 101 and the second horizontal conductive layer 104, and a vertical portion 102b directly connected to the channel layer 140 on the periphery of the channel layer 140. An upper surface of the vertical portion 102b of the first horizontal conductive layer 102 may be disposed on a lower level than an upper surface of the second horizontal conductive layer 104. In some example embodiments, in a process of etching a region corresponding to the separation structure SR to be described later with reference to FIG. 11E, a metal pad MP may be formed prior to the etching process to easily stop the etching in a region adjacent to the second horizontal conductive layer 104, even if the second horizontal conductive layer 104 is not formed to have a great thickness. In addition, since the second horizontal conductive layer 104 may not be formed to have a great thickness, difficulty of a process of removing a region corresponding to the vertical portion 102b of the first horizontal conductive layer 102 may be reduced in a process of removing the first to third horizontal insulating layers 111, 112, and 113 to be described later with reference to FIG. 11G.

The first horizontal conductive layer 102 may include a semiconductor material, for example, polycrystalline silicon. The first horizontal conductive layer 102 may be a doped layer. In a region, not illustrated, the first horizontal conductive layer 102 may not extend downwardly of a region in which the gate electrodes 130 extend by different lengths to have a staircase shape. In this case, an insulating layer, rather than the first horizontal conductive layer 102, may be disposed below the gate electrodes 130.

The second horizontal conductive layer 104 and the third horizontal conductive layer 105 may be sequentially stacked on the first horizontal conductive layer 102. Each of the second horizontal conductive layer 104 and the third horizontal conductive layer 105 may be referred to as a support layer.

A side surface of the second horizontal conductive layer 104 may be disposed to be farther from a central axis L of the separation structure SR than a side surface of the third horizontal conductive layer 105. For example, the support layers 104 and 105 may include a first portion, adjacent to a lowermost interlayer insulating layer 120L, among the interlayer insulating layer 120, and a second portion comprising a side surface disposed to be farther from the central axis of the separation structure SR than a side surface of the first portion. In a region separated by the separation structure SR, a side surface of the second horizontal conductive layer 104 may be in contact with the first conductive pattern 107. A distance W2 between side surfaces in contact with the first conductive pattern 107 of the second horizontal conductive layer 104 may be greater than a minimum width W1 of a first portion SR1 of the separation structure SR. A side surface of the second horizontal conductive layer 104 is illustrated as being fully covered with the first conductive pattern 107, but the present disclosure is not limited thereto. The side surface of the second horizontal conductive layer 104 may be in contact with a separation insulating layer 185 of the separation structure SR.

The third horizontal conductive layer 105 may be disposed between the second horizontal conductive layer 104 and the stack structure GS. The third horizontal conductive layer 105 may be disposed on a higher level than the second portion SR2 of the separation structure SR. The third horizontal conductive layer 105 may be disposed on an upper end T of the second portion SR2 of the separation structure SR. The third horizontal conductive layer 105 may be disposed on a lower level than a lowermost interlayer insulating layer 120L. The third horizontal conductive layer 105 may be disposed on a level higher than a region in which a width of the separation structure SR is discontinuously changed. The third horizontal conductive layer 105 may be disposed on the first conductive pattern 107 to cover an upper surface of the first conductive pattern 107. The third horizontal conductive layer 105 may be in contact with the first conductive pattern 107 and the second horizontal conductive layer 104. Since the third horizontal conductive layer 105 is disposed between at least a portion of the second portion SR2 of the separation structure SR and the lowermost interlayer insulating layer 120L, the first conductive pattern 107 may not be in contact with the lowermost interlayer insulating layer 120L and may be formed in only a region adjacent to the second horizontal conductive layer 104.

At least a portion of the second and third horizontal conductive layers 104 and 105 may function as a portion of a common source line of the semiconductor device 100a. For example, the at least a portion of the second and third horizontal conductive layers 104 and 105 may function as a common source line together with the second substrate 101 and the first horizontal conductive layer 102. The second and third horizontal conductive layers 104 and 105 may include a semiconductor material, for example, polycrystalline silicon. The second and third horizontal conductive layers 104 and 105 may be doped layers or layers including impurities diffused from the first horizontal conductive layer 102. In some example embodiments, when the second and third horizontal conductive layers 104 and 105 are formed of the same material, a boundary surface between the second and third horizontal conductive layers 104 and 105 may be confirmed or may not be confirmed.

The first conductive pattern 107 may be disposed in a region adjacent to the second horizontal conductive layer 104. The first conductive pattern 107 may be disposed on a level between the first horizontal insulating layer 102 and the lowermost interlayer insulating layer 120L. The first conductive pattern 107 may protrude from a side surface of the separation structure SR in a direction of the second horizontal conductive layer 104. The first conductive pattern 107 may be disposed between the separation structure SR and the second horizontal conductive layer 104. The first conductive pattern 107 is illustrated as having an angular shape, but a shape thereof is not limited thereto. The first conductive pattern 107 may have various shapes such as a curved boundary surface.

An upper surface of the first conductive pattern 107 may be covered with the third horizontal conductive layer 105. The first conductive pattern 107 may be in contact with a side surface of the second horizontal conductive layer 104, a lower surface of the third horizontal conductive layer 105, and the separation structure SR. The first conductive pattern 107 may be disposed on a lower level than the lowermost interlayer insulating layer 120L. In a manufacturing process to be described later with reference to FIG. 11C, since the third horizontal conductive layer 105 is stacked on the second horizontal conductive layer 104 to be disposed on the metal pad MP, the lowermost interlayer insulating layer 120L may not be etched in a process of etching the first to third horizontal insulating layers 111, 112, and 113 to be described later with reference to FIG. 11G. Thus, the first conductive pattern 107 may not be in contact with the lowermost interlayer insulating layer 120L.

The first conductive pattern 107 may comprise a pair of patterns symmetrical with respect to the central axis L of the separation structure SR. A distance W2 between side surfaces of the pair of first conductive patterns 107 in contact with the second horizontal conductive layer 104 may be greater than the minimum width W1 of the first portion SR1 of the separation structure SR.

The first conductive pattern 107 may be formed of the same material as the first horizontal conductive layer 102. The first conductive pattern 107 may include a semiconductor material, for example, polycrystalline silicon.

The gate electrodes 130 may be spaced apart from each other vertically and stacked on the second substrate 101 to constitute a stack structure GS. The gate electrodes 130 may include a lower gate electrode 130L constituting a gate of a ground select transistor, memory gate electrodes 130M constituting a plurality of memory cells, and upper gate electrodes 130U constituting gates of string select transistors. The number of memory gate electrodes 130M, constituting memory cells, may be determined depending on capacity of the semiconductor device 100a. According to example embodiments, the number of the upper gate electrodes 130U and the number of the lower gate electrode 130L may each be 1 to 4 or more, and the upper and lower gate electrodes 130U and 130L may have the same structure as or different structure from the memory gate electrodes 130M. In example embodiments, the gate electrodes 130 may further include a gate electrode 130 disposed above the upper gate electrodes 130U and/or below the lower gate electrodes 130L and constituting an erase transistor used in an erase operation based on gate-induced drain leakage (GIDL). In addition, some of the gate electrodes 130, for example, the memory gate electrodes 130M, adjacent to the upper or lower gate electrodes 130U and 130L, may be dummy gate electrodes.

The gate electrodes 130 may include a metal material such as tungsten (W). According to some example embodiments, the gate electrodes 130 may include polycrystalline silicon or a metal silicide material. In some example embodiments, the gate electrodes 130 may further include a diffusion barrier (not shown). For example, the diffusion barrier may include tungsten nitride (WN), tantalum nitride (TaN), and titanium nitride (TiN), or combinations thereof.

The interlayer insulating layers 120 may be disposed between the gate electrodes 130. Similarly to the gate electrodes 130, the interlayer insulating layers 120 may be spaced apart from each other in a direction, perpendicular to an upper of the second substrate 101, and may be disposed to extend in the X direction. The interlayer insulating layers 120 may include an insulating material such as a silicon oxide or a silicon nitride.

According to some example embodiments, in which the separation structure SR includes the separation insulating layer 185, the following description of the separation structure SR may be interpreted as a description of the separation insulating layer 185.

The separation structure SR may be disposed to extend through the gate electrodes 130 in the Y direction. The separation structure SR may penetrate through the stack structure GS including all of the gate electrodes 130 stacked on the second substrate 101, the first horizontal conductive layer 102, and the second horizontal conductive layer 104 to be connected to the second substrate 101. In some example embodiments, a lowermost surface of the separation structure SR may be disposed on a higher level than a lowermost surface of the channel structure CH. The lowermost surface of the separation structure SR is illustrated as being disposed on the same level as a lower surface of the first horizontal conductive layer 102, but the present disclosure is not limited thereto. The lowermost surface of the separation structure SR may be disposed on a lower level than the lower surface of the first horizontal conductive layer 102. In some example embodiments, the separation structure SR may be formed to be recessed inwardly of at least a portion of the second substrate 101.

Figure 11A:
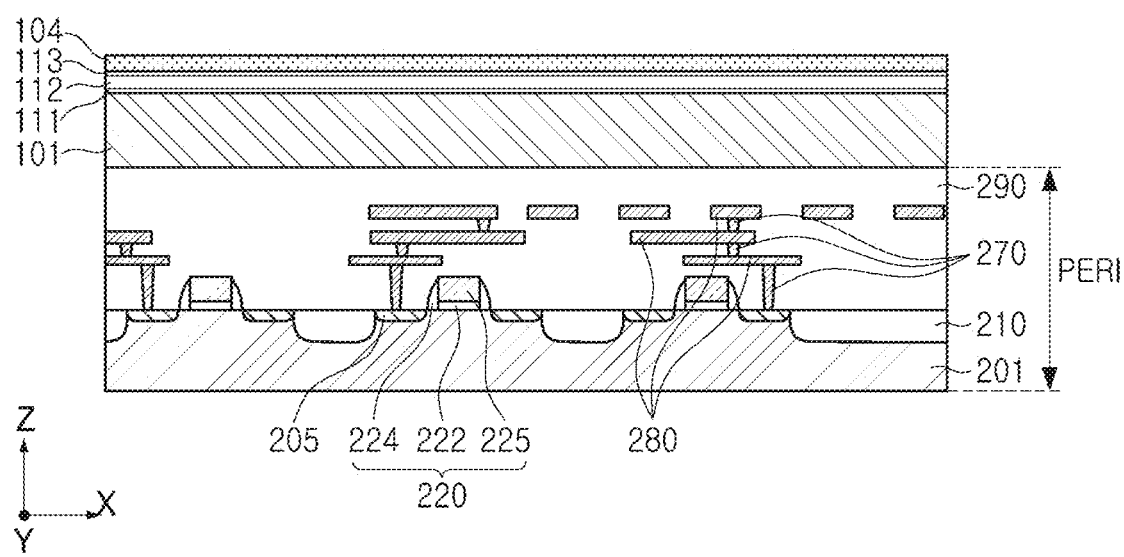
FIGS. 11A to 11I are schematic views illustrating a method of manufacturing a semiconductor device according to example embodiments.

The separation structure SR may include a bent portion formed due to a difference in width in a region adjacent to the second and third horizontal conductive layers 104 and 105. The separation structure SR may include a first portion SR1, having a continuously decreased width, and a second portion SR2 disposed below the first portion SR1 and having a discontinuously changed width. The first portion SR1 of the separation structure SR may penetrate through the stack structure GS, and the second portion SR2 may penetrate through the first and second horizontal conductive layers 102 and 104. The second portion SR2 of the separation structure SR may correspond to a region in which a metal pad MP to be described with reference to FIG. 11F is removed.

The first portion SR1 of the separation structure SR may have a shape in which a width thereof is decreased in a direction toward the second substrate 101 due to a high aspect ratio. The first portion SR1 of the separation structure SR may have a minimum width W1 in a lower portion of the first region SR1, and the second portion SR2 may have a width W3 greater than the minimum width of the first portion SR1. An upper portion of the second portion SR2 of the separation structure SR may have a greater width than the lower portion of the first portion SR1. The second portion SR2 of the separation structure SR may include a region, having a width increased in a direction toward the second substrate 101, and a region having a width decreased in a direction toward the second substrate 101. For example, the second portion SR2 of the separation structure SR may have a maximum width between an upper end T of the second portion SR2 and a lowermost surface of the separation structure SR. In the some example embodiments, the upper end T of the second portion SR2 of the separation structure SR is defined as a point at which a width of the separation structure SR is discontinuously changed from the first portion SR1. At least a portion of the second portion SR2 of the separation structure SR may be disposed on a higher level than the lowermost surface of the second horizontal conductive layer 104. The third horizontal conductive layer 105 may be disposed on the upper end T of the second part SR2 of the separation structure SR.

A height H of the second portion SR2 of the separation structure SR may be substantially the same as the sum of a thickness VT1 of the first horizontal conductive layer 102 and a thickness VT2 of the second horizontal conductive layer 104, but is not limited thereto. In example embodiments, the height H1 of the second portion SR2 of the separation structure SR may be greater than the sum of the thickness VT1 of the first horizontal conductive layer 102 and the thickness VT2 of the second horizontal conductive layer 104.

The separation structure SR may include a separation insulating layer 185. The isolation insulating layer 185 may include an insulating material. In example embodiments, the separation structure SR may further include a conductive layer disposed in the separation insulating layer 185. In this case, the conductive layer may function as a common source line of the semiconductor device 100*a* or a contact plug connected to the common source line.

The channel structures CH may each constitute a single memory cell string, and may be disposed to be spaced apart from each other while forming a row and a column. Each of the channel structures CH have a columnar shape, and may have an inclined side surface narrowed in a direction toward the second substrate 101 according to an aspect ratio.

The channel layer 140 may be disposed in the channel structures CH. In the channel structures CH, the channel layer 140 may be formed to have an annular shape surrounding a channel buried insulating layer 150. However, according to example embodiments, the channel layer 140 may have a columnar shape such as a cylindrical shape or a prismatic shape without the channel buried insulating layer 150. The channel layer 140 may be connected to the first horizontal conductive layer 102 in a lower portion thereof. The channel layer 140 may include a semiconductor material such as polycrystalline silicon or single-crystalline silicon.

In the channel structure CH, channel pads 155 may be disposed on the channel layer 140. The channel pads 155 may be disposed to cover the upper surface of the channel buried insulating layer 150 and to be electrically connected to the channel layer 140. The channel pads 155 may include, for example, doped polycrystalline silicon.

A gate dielectric layer 145 may be disposed between the gate electrodes 130 and the channel layer 140. Although not illustrated in detail, the gate dielectric layer 145 may include a tunneling layer, a charge storage layer, and a blocking layer sequentially stacked from the channel layer 140. The tunneling layer may tunnel charges to the charge storage layer and may include, for example, a silicon oxide ($SiO_2$), a silicon nitride ($Si_3N_4$), a silicon oxynitride (SiON), or combinations thereof. The charge storage layer may be a charge trapping layer or a floating gate conductive layer. The blocking layer may include a silicon oxide ($SiO_2$), a silicon nitride (Si$_3$N$_4$), a silicon oxynitride (SiON), a high-k dielectric material, or combinations thereof. In example embodiments, at least a portion of the gate dielectric layer 145 may extend along the gate electrodes 130 in a horizontal direction.

An upper separation region 180 may be disposed to penetrate through a portion of gate electrodes 130 including uppermost upper gate electrodes 130U, among the gate electrodes 130. The upper separation region 180 may separate a total of four gate electrodes 130 including the upper gate electrodes 130U from each other in the Y direction. However, the number of gate electrodes 130, separated from each other by the upper separation region 180, may be changed in various manners in example embodiments. The upper gate electrodes 130U, separated from each other by the upper separation region 180, may constitute different string select lines. The upper separation region 180 may include an insulating material. The insulating material may include, for example, a silicon oxide, a silicon nitride, and/or a silicon oxynitride.

A cell insulating layer 190 may be disposed on the stack structure GS. The cell insulating layer 190 may be formed of an insulating material, and may include a plurality of insulating layers.

In FIGS. 3 to 9, descriptions of the same components as those described in FIGS. 1 to 2 will be omitted, and only modified components of the semiconductor device will be described.

Figure 3:
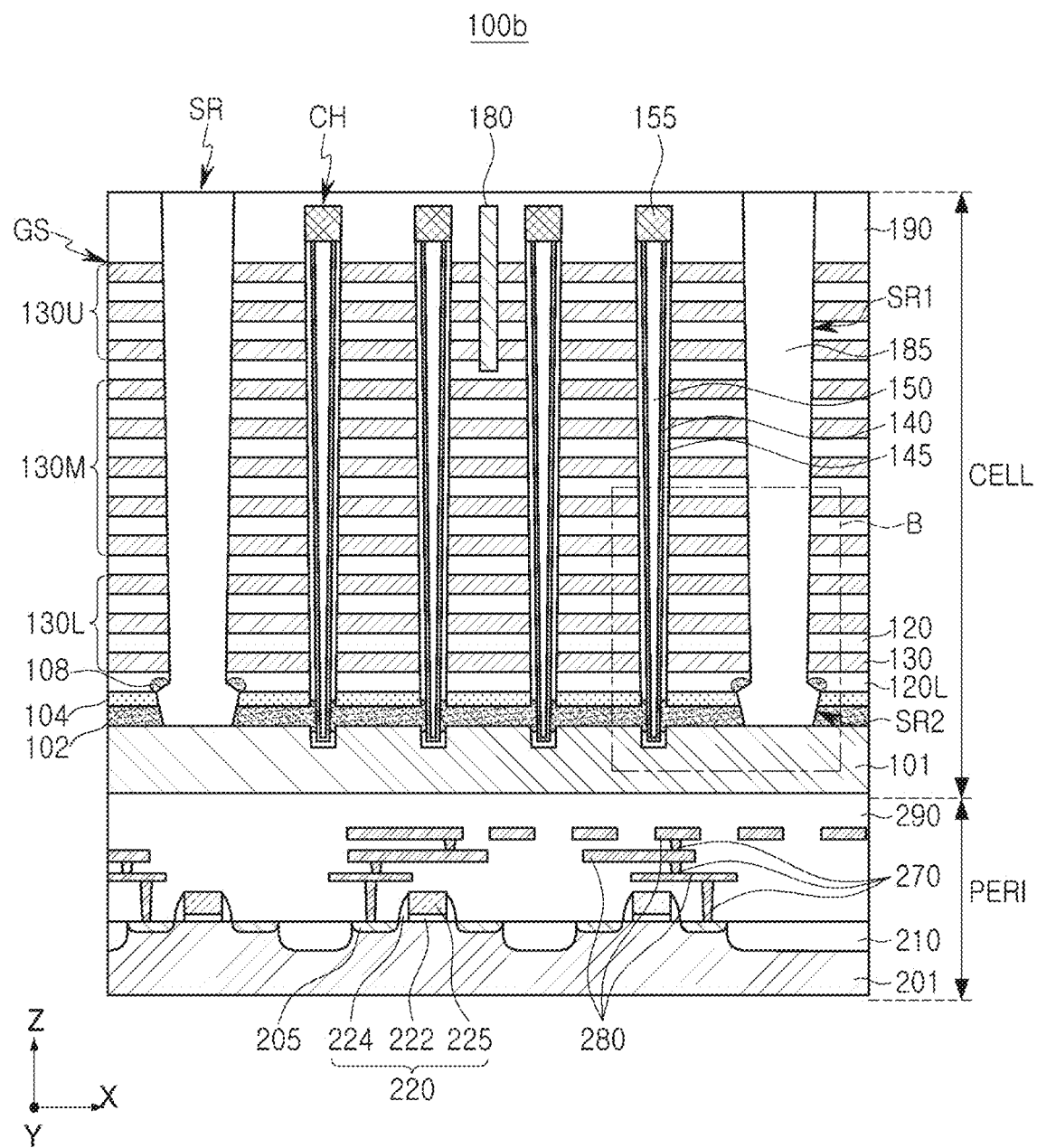
FIG. 3 is a schematic cross-sectional view of a semiconductor device according to example embodiments.
Figure 4:
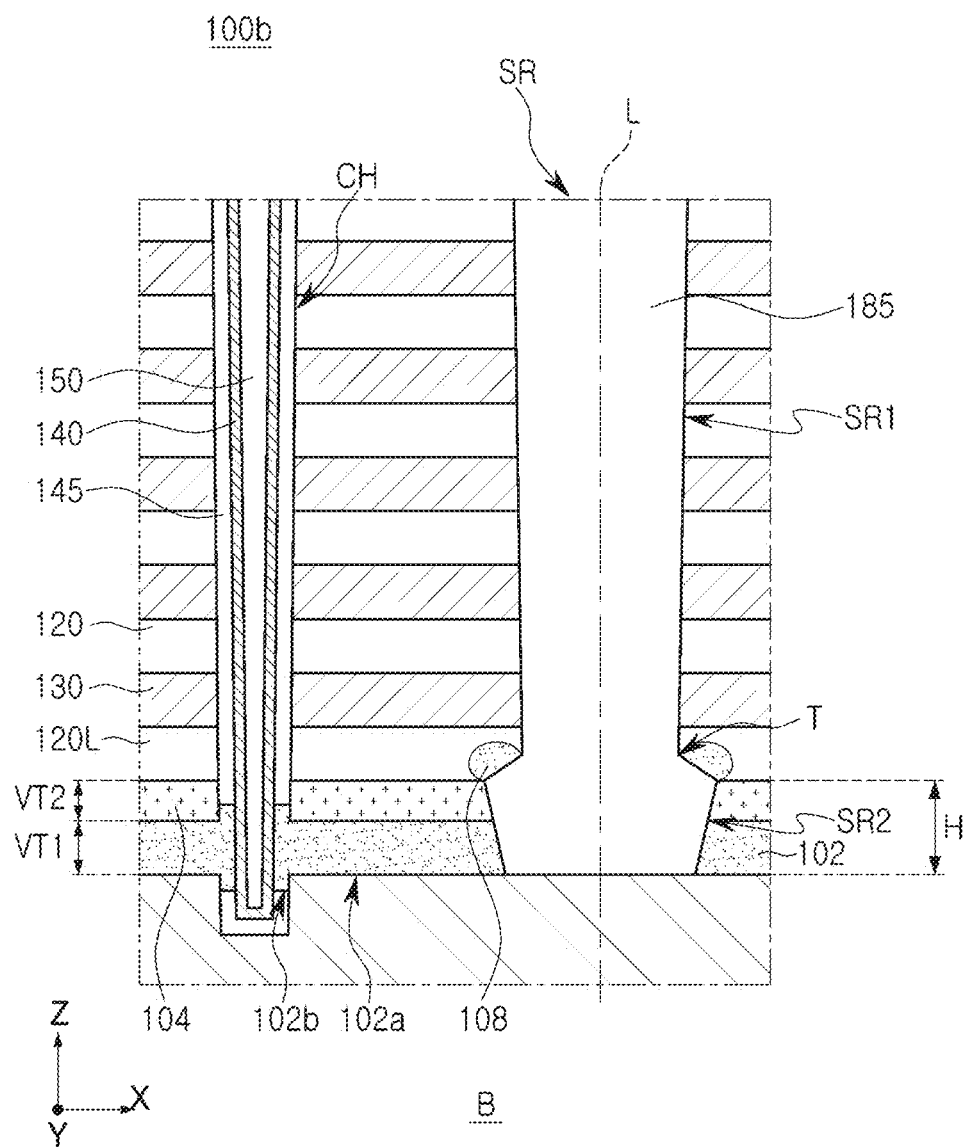
FIG. 4 is a partially enlarged view of a semiconductor device according to example embodiments.

FIG. 3 is a schematic cross-sectional view of a semiconductor device according to example embodiments. FIG. 4 is a partially enlarged view of a semiconductor device according to example embodiments. FIG. 4 is an enlarged view of region "B" of FIG. 3.

Referring to FIGS. 3 and 4, unlike the semiconductor device 100a of FIG. 1, a semiconductor device 100b may not include a third horizontal conductive layer 105. In the semiconductor device 100b, a memory cell structure CELL may include a separation structure SR, including a bent portion in a region adjacent to a lowermost interlayer insulating layer 120L and a second horizontal conductive layer 104, and a second conductive pattern 108 protruding outwardly of the separation structure SR from a side surface of the separation structure SR.

A second conductive pattern 108 may be disposed in a region adjacent to the second horizontal conductive layer 104. The second conductive pattern 108 may be disposed on a level between a first horizontal insulating layer 102 and a lowermost interlayer insulating layer 120L. The second conductive pattern 108 may protrude from a side surface of the separation structure SR in a direction of the lowermost interlayer insulating layer 120L on a boundary between a first portion SR1 and a second portion SR2 of the separation structure SR. The second conductive pattern 108 may be disposed between the separation structure SR and the lowermost interlayer insulating layer 120L. The second conductive pattern 108 is illustrated as only being in contact with the lowermost interlayer insulating layer 120L, but the present disclosure is not limited thereto. The second conductive pattern 108 may be in contact with a side surface of a second horizontal conductive layer 104. The second conductive pattern 108 may be disposed on a higher level than a lower surface of the lowermost interlayer insulating layer 120L. The second conductive pattern 108 may comprise a pair of patterns symmetrical with respect to a central axis L of the separation structure SR.

In some example embodiments, in a semiconductor device manufactured by a manufacturing process to be described with reference to FIGS. 12A to 12E, the third horizontal conductive layer 105 of FIGS. 1 and 2 is not formed. Therefore, in an etching process to be desired with reference to FIG. 12D, at least a portion of the lowermost interlayer insulating layer 120L may be removed together with first to third horizontal insulating layers 111, 112, and 113. Accordingly, the second conductive pattern 108 may be in contact with the lowermost interlayer insulating layer 120L.

The second conductive pattern 108 may be formed of the same material as the first horizontal conductive layer 102. The second conductive pattern 108 may include a semiconductor material, for example, polycrystalline silicon.

The separation structure SR may include a first portion SR1, having a continuously decreased width, and a second portion SR2 having a discontinuously changed width below the first portion SR1. That is, the width may be greater at an upper portion of the first portion SR1 and smaller at a lower portion of the first portion SR1. The first portion SR1 of the separation structure SR may penetrate through a stack structure GS, and the second portion SR2 may penetrate through at least a portion the first and second horizontal conductive layers 102 and 104 and the lowermost interlayer insulating layer 120L.

At least a portion of the second portion SR2 of the separation structure SR may be disposed on a higher level than a lower surface of the lowermost interlayer insulating layer 120L. An upper end T of the second portion SR2 of the separation structure SR may be disposed on a higher level than the second horizontal conductive layer 104. The upper end T of the second portion SR2 of the separation structure SR may be disposed on a higher level than the lower surface of the lowermost interlayer insulating layer 120L.

Among the interlayer insulating layers 120, the lowermost interlayer insulating layer 120L may include a first portion, having a side surface relatively close to a central axis L of the separation structure SR, and a second portion having a side surface disposed relatively distant from the central axis L of the separation structure SR. The first portion may be adjacent to a lowermost gate electrode 130 disposed on the lowermost interlayer insulating layer 120L, and the second portion may be adjacent to the second horizontal conductive layer 104.

Figure 5:
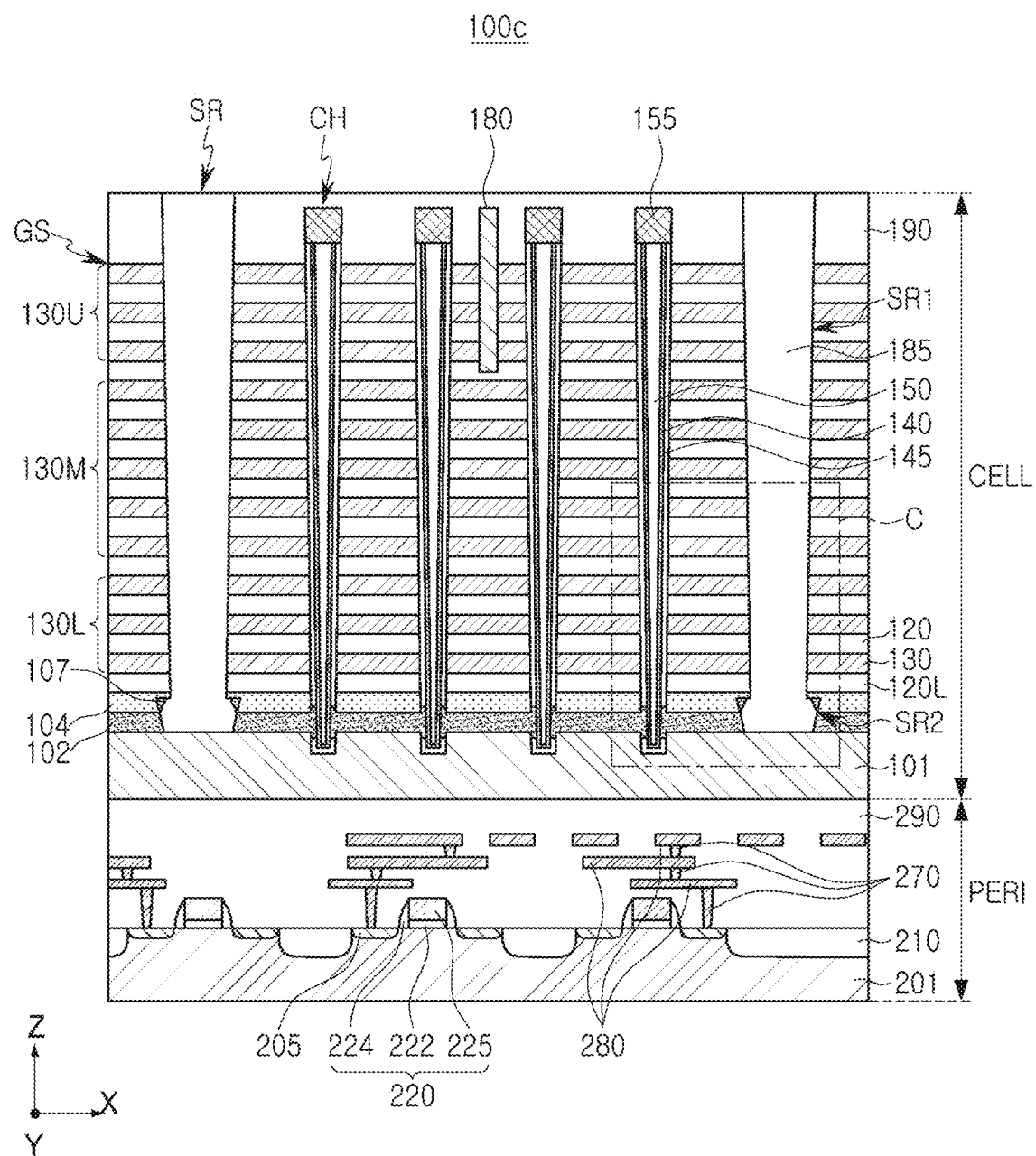
FIG. 5 is a schematic cross-sectional view of a semiconductor device according to example embodiments.
Figure 6:
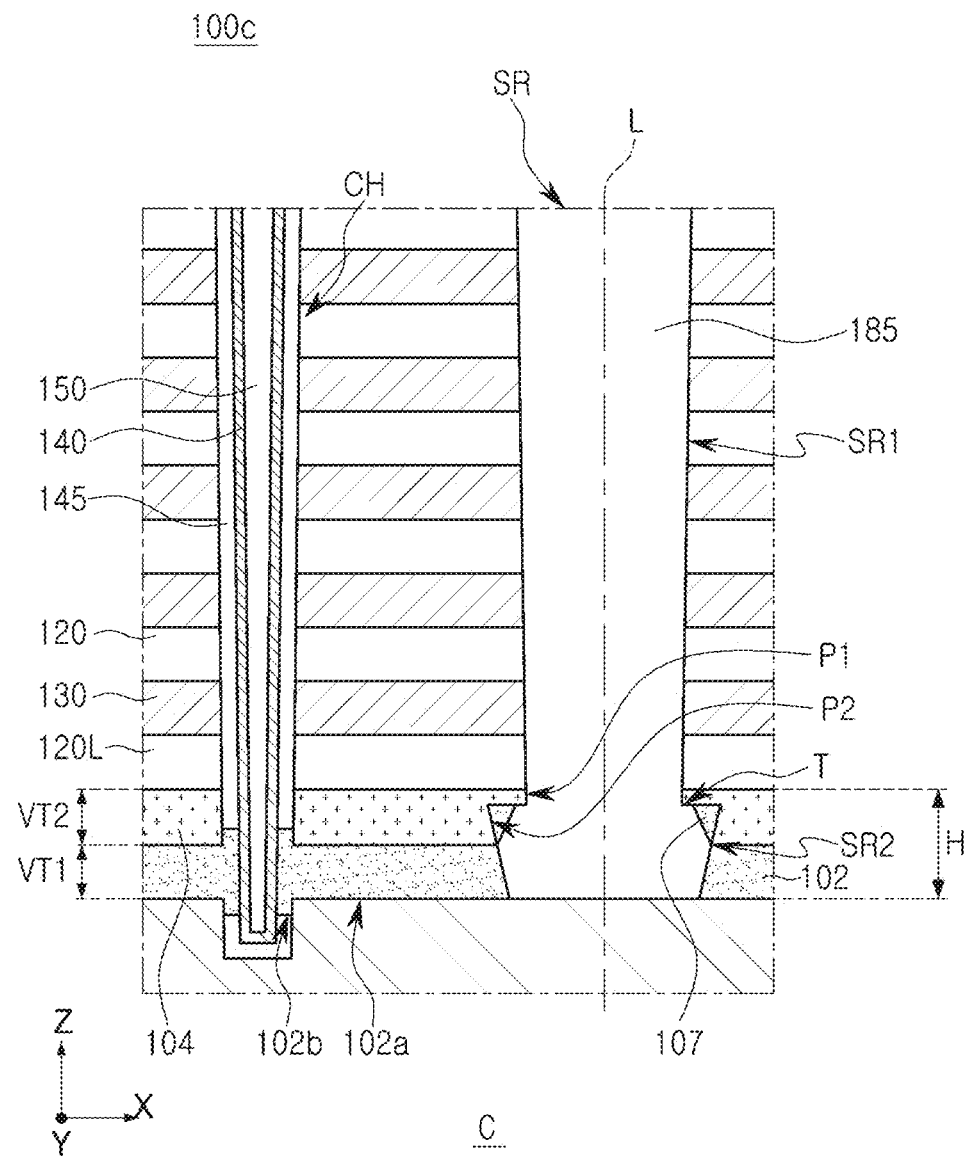
FIG. 6 is a partially enlarged view of a semiconductor device according to example embodiments.

FIG. 5 is a schematic cross-sectional view of a semiconductor device according to example embodiments. FIG. 6 is a partially enlarged view of a semiconductor device according to example embodiments. FIG. 6 is an enlarged view of region "C" of FIG. 5

Referring to FIGS. 5 and 6, a semiconductor device 100c may include a support layer including a first portion P1, adjacent to a lowermost interlayer insulating layer 120L, and a second portion P2 disposed below the first portion P1.

In some example embodiments, the support layer may include a second horizontal conductive layer 104, and a boundary surface may not be disposed between the first portion P1 and the second portion P2 of the support layer 104. The first portion P1 of the support layer 104 may protrude further to the separation structure SR than the second portion P2. A side surface of the first portion P1 of the support layer 104 may be closer from a central axis L of the separation structure SR than a side surface of the second portion P2.

A first conductive pattern 107 may be in contact with a lower surface of the first portion P1 and a side surface of the second portion P2 of the support layer 104 adjacent to the separation structure SR.

An upper end T of the second portion SR2 of the separation structure SR may be disposed on a lower level than an upper surface of the support layer 104. For example, a point, at which a width of the separation structure SR is continuously decreased in a direction toward the second substrate 101 and is then discontinuously changed, may be disposed on a lower level than the upper surface of the support layer 104. That is, the support layer 104 have a middle surface parallel to the upper and lower surfaces of the support layer 104.

Figure 7:
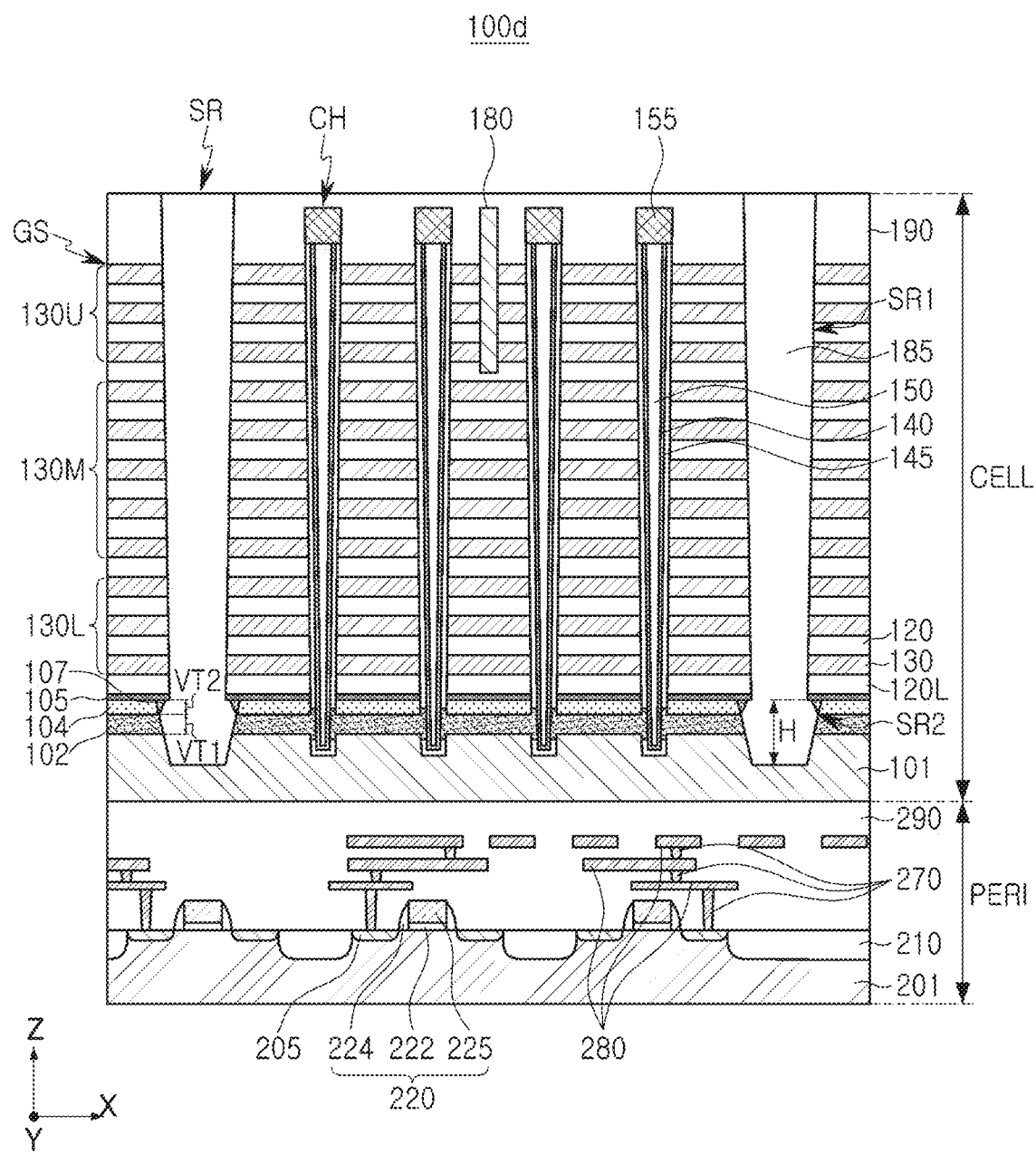
FIG. 7 is a schematic cross-sectional view of a semiconductor device according to example embodiments.

FIG. 7 is a schematic cross-sectional view of a semiconductor device according to example embodiments.

Referring to FIG. 7, in a semiconductor device 100d, a lowermost surface of a separation structure SR may be disposed on a lower level than a lower surface of a first horizontal conductive layer 102. The lowermost surface of the separation structure SR may be disposed on a lower level than a lowermost surface of a channel structure CH. A height H of a second portion SR2 of the separation structure SR is greater than the sum of a thickness VT1 of the first horizontal conductive layer 102 and a thickness VT2 of a second horizontal conductive layer 104.

Figure 11B:
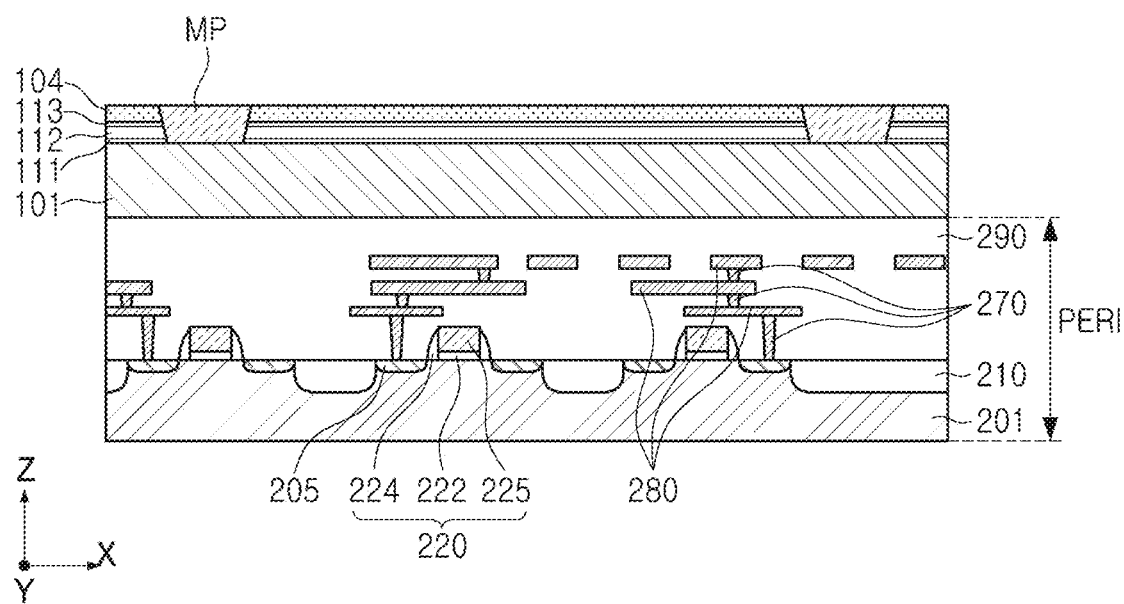

When a metal pad MP to be described in FIG. 11B is formed, a degree of recessing the second substrate 101 may be adjusted to adjust a height of the metal pad MP may be adjusted. Since the metal pad MP serves as an etch-stop layer, the height of the metal pad MP may be freely changed to reduce difficulty of an etching process of FIG. 11E. As described above, when the metal pad MP is formed to be lower than the lowermost surface of the channel structure CH in a process of forming the metal pad MP of FIG. 11B, the lowermost surface of the separation structure SR is of the channel structure CH may be disposed to be lower than the lowermost surface of the channel structure CH.

Figure 8:
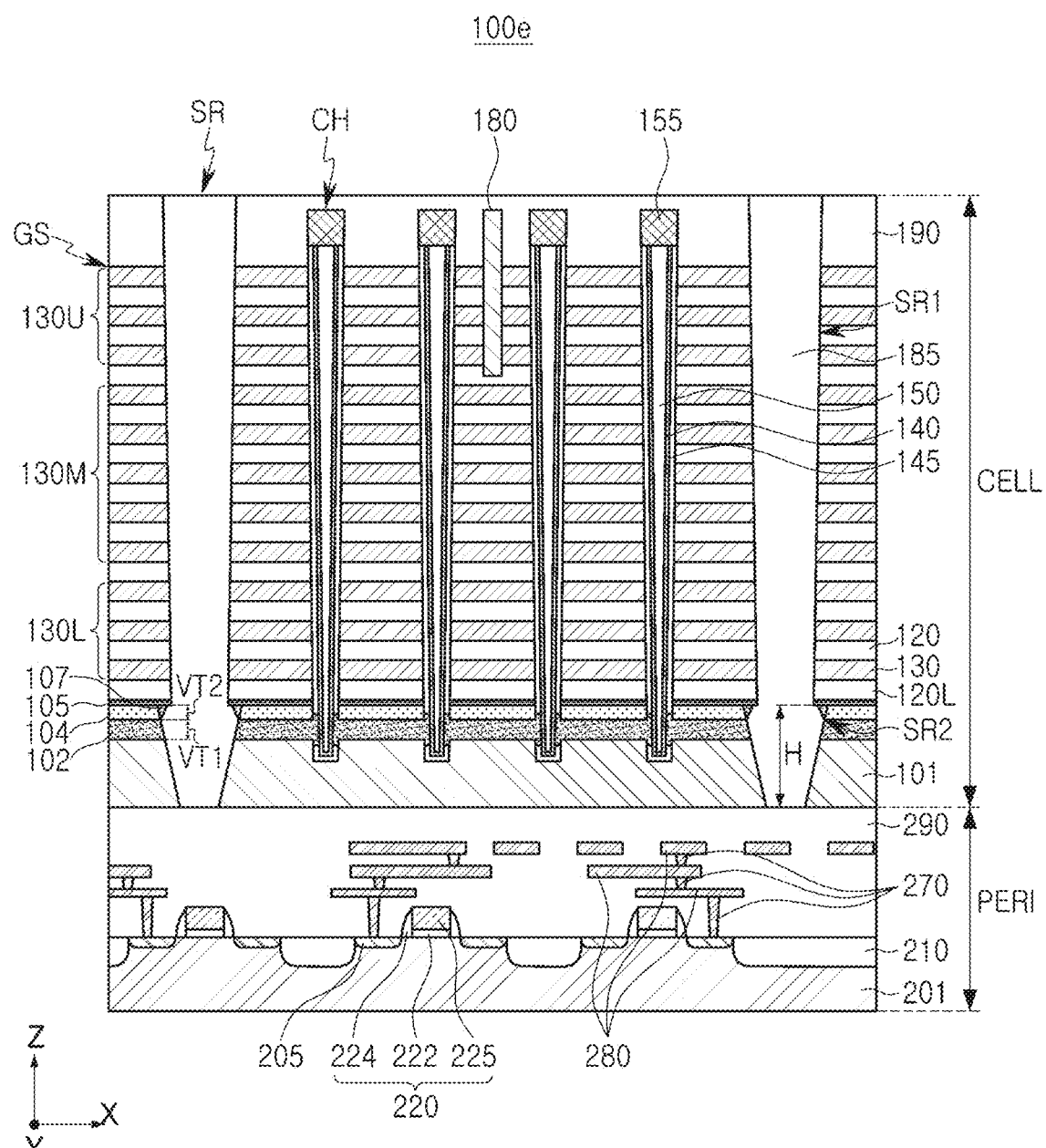
FIG. 8 is a schematic cross-sectional view of a semiconductor device according to example embodiments.

FIG. 8 is a schematic cross-sectional view of a semiconductor device according to example embodiments.

Referring to FIG. 8, in a semiconductor device 100e, a lowermost surface of a separation structure SR may penetrate through an entire second substrate 101. The lowermost surface of the separation structure SR may be disposed on a lower level than a lower surface of a first horizontal conductive layer 102, and may be disposed on a lower level than a lowermost surface of a channel structure CH. The lowermost surface of the separation structure SR may be disposed on substantially the same level as a lower surface of the first substrate 101. According to some example embodiments, the lowermost surface of the separation structure SR may be disposed on a lower level than an upper surface of a peripheral insulating layer 290 by recessing a portion of the peripheral insulating layer 290. A height H of a second portion SR2 of the separation structure SR may be greater than the sum of a thickness VT1 of a first horizontal conductive layer 102 and a thickness VT2 of a second horizontal conductive layer 104. The height H of the second portion SR2 of the separation structure SR may be substantially the same as the sum of the thickness VT1 of the first horizontal conductive layer 102, the thickness VT2 of the second horizontal conductive layer 104, and a thickness of the second substrate 101.

When the metal pad MP to be described in FIG. 11B is formed to penetrate through the entire second substrate 101, the lowermost surface of the separating structure SR may be disposed on substantially the same level as a lowermost surface of the second substrate 101.

Figure 9:
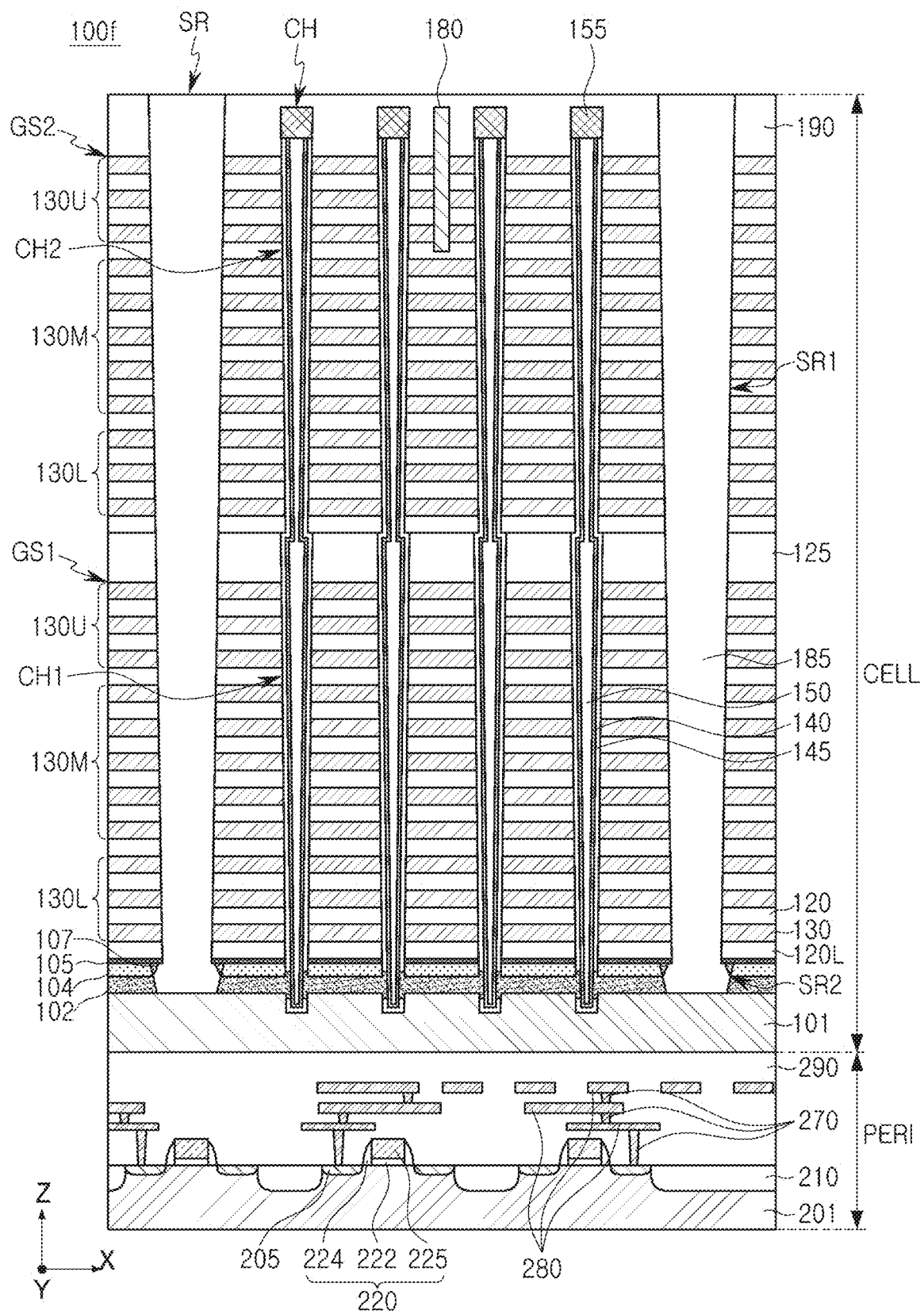
FIG. 9 is a schematic cross-sectional view of a semiconductor device according to example embodiments.

FIG. 9 is a schematic cross-sectional view of a semiconductor device according to example embodiments.

Referring to FIG. 9, a semiconductor device 100f may include a lower stack structure GS1 and an upper stack structure GS2 in which stack structures of gate electrodes 130 are vertically stacked. Channel structures CH may include lower channel structures CH1, penetrating through the lower stack structure GS1, and upper channel structures CH2 penetrating through the upper stack structure GS2. Such a structure of the channel structures CH may be introduced to stably form the channel structures CH when the number of the stacked gate electrodes 130 is relatively great.

The channel structures CH may have a shape in which the lower channel structures of the lower stack structure GS1 and the upper channel structures CH2 of the upper stack structure GS2 are connected to each other, and may include a bent portion formed due to a difference in width in a connection region. A channel layer 140 and a channel insulating layer 150 may be in a state of being connected to each other between the lower channel structure CH1 and the upper channel structure CH2. A channel pad 155 may be disposed on only the upper channel structure CH2. However, in example embodiments, each of the lower channel structure CH1 and the upper channel structure CH2 may include a channel pad 155. In this case, the channel pad 155 of the lower channel structure CH1 may be connected to the channel layer 140 of the upper channel structure CH2. An upper interlayer insulating layer 125 having a relatively great thickness may be disposed on an uppermost portion of the lower stack structure GS1. However, shapes of the interlayer insulating layers 120 and the upper interlayer insulating layer 125 may be changed in various ways in example embodiments.

Figure 10:
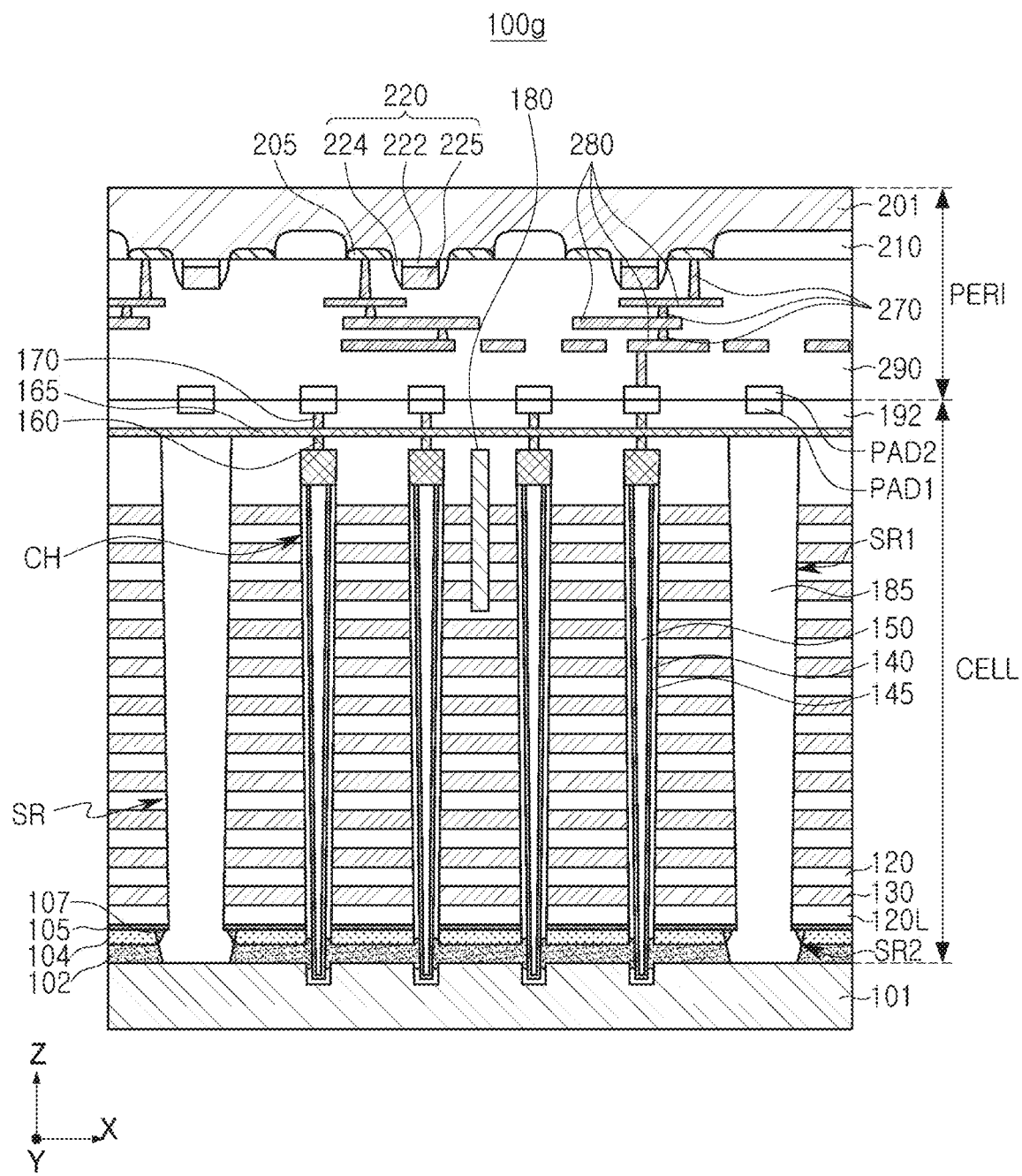
FIG. 10 is a schematic cross-sectional view of a semiconductor device according to example embodiments.

FIG. 10 is a schematic cross-sectional view of a semiconductor device according to example embodiments.

Referring to FIG. 10, in a semiconductor device 100g, a memory cell structure CELL may be disposed below a peripheral circuit structure PERI.

The memory cell structure CELL may further include a channel contact plug 160 disposed on channel pads 155 in the semiconductor device 100a described in FIGS. 1 to 2, bitlines 165 disposed on the channel contact plug 160, an upper insulating layer 192 disposed on a cell insulating layer 190, and an upper vertical interconnection 170. The memory cell structure CELL may further include first bonding pads PAD1. At least some of the first bonding pads PAD1 may be disposed between the bitlines 172 and a peripheral circuit structure PERI. The peripheral circuit structure PERI may further include second bonding pads PAD2 in a region corresponding to the first bonding pads PAD1 of the memory cell structure CELL. The second bonding pads PAD2 may be brought into contact with the first bonding pads PAD1 to be bonded thereto. A peripheral circuit may be disposed on the second bonding pads PAD2, and a first substrate 201 may be disposed on the peripheral circuit.

The channel contact plug 160, the bitlines 165, and the upper vertical wiring 170 may be electrically connected to each other. The bitlines 165 may be electrically connected to a plurality of channel vertical structures CH between the peripheral circuit structure PERI and a stack structure GS.

The upper insulating layer 192 may be formed of an insulating material. The upper vertical interconnection 170 and the bitlines 165 may be formed of a conductive material. The first bonding pad PAD1 and the second bonding pad PAD2 may include a conductive material, for example, copper (Cu). In example embodiments, the memory cell structure CELL and the peripheral circuit structure PERI may be bonded by, for example, copper-to-copper (Cu-to-Cu) bonding.

The description of the semiconductor device 100g of FIG. 10 may be equally applied to the semiconductor devices of FIGS. 1 to 9.

FIGS. 11A to 11I are schematic views illustrating a method of manufacturing a semiconductor device according to example embodiments.

Referring to FIG. 11A, a peripheral circuit structure PERI, including circuit elements 220 and lower interconnection structures, may be formed on a first substrate 201, and a second substrate 101, first to third horizontal insulating layers 111, 112, and 113, and the second horizontal conductive layer 104, provided by a memory cell structure CELL, may be formed on the peripheral circuit structure PERI.

Device separation layers 210 may be formed in a first substrate 201, and then a circuit gate dielectric layer 222 and a circuit gate electrode 225 may be sequentially formed on the first substrate 201. The device isolation layers 210 may be formed by, for example, a shallow trench separation (STI) process. The circuit gate dielectric layer 222 and the circuit gate electrode 225 may be formed using atomic layer deposition (ALD) or chemical vapor deposition (CVD). The circuit gate dielectric layer 222 may be formed of a silicon oxide, and the circuit gate electrode 225 may be formed of at least one of polycrystalline silicon and metal silicide, but the present disclosure is not limited thereto. A spacer layer 224 and source/drain regions 205 may be formed on both sidewalls of the circuit gate dielectric layer 222 and the circuit gate electrode 225. According to some example embodiments, the spacer layer 224 may include a plurality of layers. Then, an ion implantation process may be performed to form the source/drain regions 205.

Among the lower interconnection structures, circuit contact plugs 270 may be formed by forming a portion of a peripheral insulating layer 290, etching the portion to be removed, and burying a conductive material. The circuit interconnection lines 280 may be formed by depositing a conductive material and patterning the deposited conductive material.

The peripheral insulating layer 290 may include a plurality of insulating layers. The peripheral insulating layer 290 may be ultimately formed to cover the circuit elements 220 and the lower interconnection structures by forming a portion of the peripheral insulating layer 290 in each process of forming the lower interconnection structures and forming a portion of the peripheral insulating layer 290 on an uppermost circuit interconnection line 280.

The second substrate 101 may be formed on the peripheral insulating layer 290. The first substrate 101 may be formed of, for example, polycrystalline silicon and may be formed by a CVD process. Polycrystalline silicon, forming the first substrate 101, may include impurities.

The first to third horizontal insulating layers 111, 112, and 113 may be sequentially stacked on the first substrate 101. Some of the first to third horizontal insulating layers 111, 112, and 113 may be replaced with the first horizontal conductive layer 102 of FIG. 1 through a subsequent process. The first and third horizontal insulating layers 111 and 113 may include a material different from a material of the second horizontal insulating layer 112. For example, the first and third horizontal insulating layers 111 and 113 may be formed of the same material as interlayer insulating layers 120 to be described in FIG. 11D, and the second horizontal insulating layer 112 may be formed of the same material as first sacrificial insulating layers 110 to be described in FIG. 11D.

The second horizontal conductive layer 104 may be formed on the first to third horizontal insulating layers 111, 112, and 113.

Referring to FIG. 11B, a metal pad MP may be formed to penetrate through the first to third horizontal insulating layers 111, 112 and 113 and the second horizontal conductive layer 104.

In a location corresponding to the separation structure SR of FIG. 1, a mask layer may be formed using a photolithography process, and then an etching process may be performed on the first to third horizontal insulating layers 111, 112, and 113 and the second horizontal conductive layer 104 to form an opening. An upper portion of the opening may be formed to have a width greater than a minimum width of the first portion SR1 of the separation structure SR of FIG. 1. In example embodiments, the second substrate 101 may be etched together in the etching process, and the opening may be formed to have different heights by adjusting the degree of etching.

The metal pad MP may be formed by burying a conductive material, for example, tungsten, or the like, in the opening and then performing a chemical mechanical polishing (CMP) process.

An upper end of the metal pad MP may be formed to have a width greater than the minimum width of the first portion SR1 of the separation structure SR of FIG. 1.

According to the height of the opening, a lowermost surface of the metal pad MP may be disposed on substantially the same level as a lower surface of the first horizontal insulating layer 111, or on a lower level than a lower surface of the first horizontal insulating layer 111, or on substantially the same level as the lowermost surface of the second substrate 101.

Figure 11C:
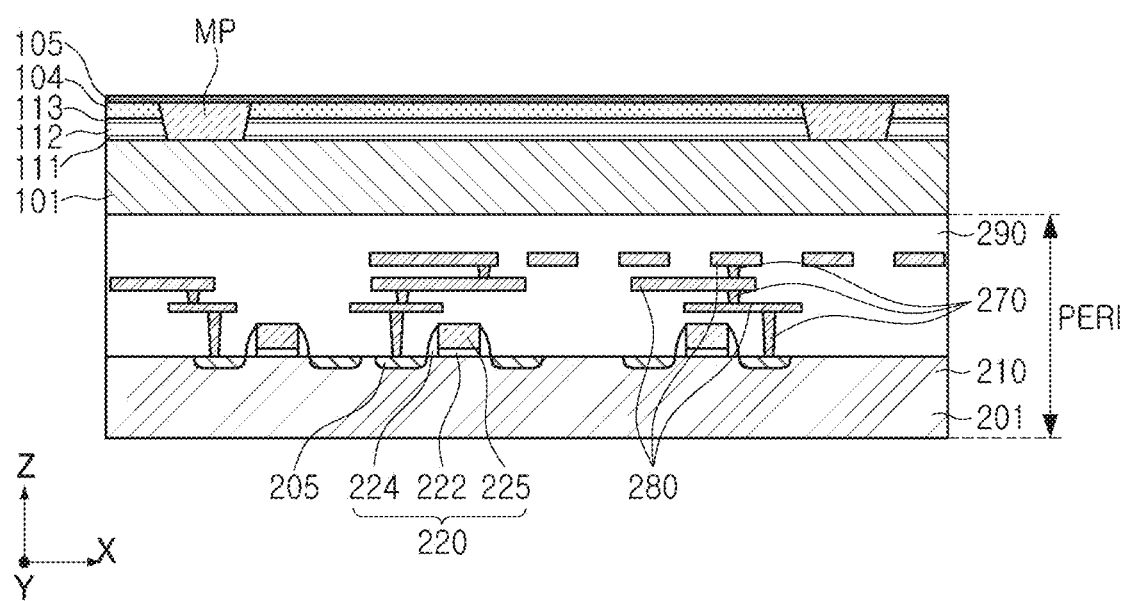

Referring to FIG. 11C, after the metal pad MP is formed, a third horizontal conductive layer 105 may be formed on the second horizontal conductive layer 104 and the metal pad MP. The third horizontal conductive layer 105 may be formed to cover an entire upper surface of the metal pad MP.

Figure 11D:
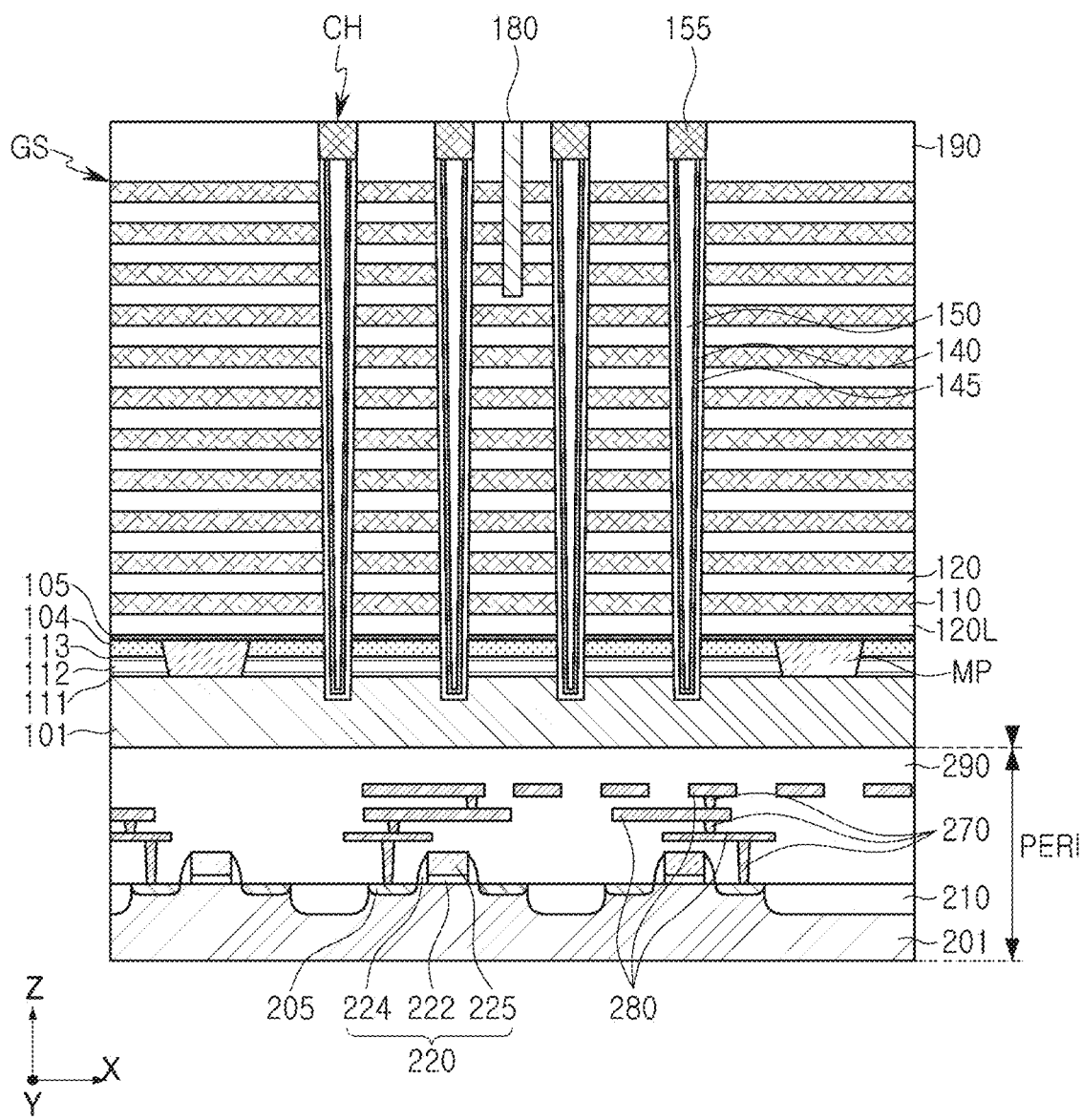

Referring to FIG. 11D, a sacrificial insulating layers 110 and an interlayer insulating layers 120 may be alternately stacked on the third horizontal conductive layer 105 to form a stack structure GS, and then an upper separation region 180 and channel structures CH may be formed to penetrate through the stack structure GS.

Some of the sacrificial insulating layers 110 may be replaced with gate electrodes 130 (see FIG. 1) through a subsequent process. The sacrificial insulating layers 110 may be formed of a material different from a material of the interlayer insulating layers 120, and may be formed of a material having an etch selectivity with respect to the interlayer insulating layers 120 under specific etching conditions. For example, the interlayer insulating layer 120 may be formed of a material, one selected from of silicon, a silicon oxide, a silicon carbide, and/or a silicon nitride, different from the material of the interlayer insulating layer 120. In some example embodiments, the interlayer insulating layers 120 may not all have the same thickness. The thicknesses and the numbers of the interlayer insulating layers 120 and the sacrificial insulating layers 110 may be variously changed from those illustrated in the drawing.

Since the third horizontal conductive layer 105 is formed to cover the upper surface of the metal pad MP in FIG. 11C before the interlayer insulating layers 120 are formed, a lowermost interlayer insulating layer 120L may not be in contact with the metal pad MP.

An upper separation region 180 may be formed by removing a portion of the sacrificial insulating layers 110 and the interlayer insulating layers 120. The upper separation region 180 may be formed by exposing a region, in which the upper separation region 180 is to be formed, using a separate mask layer, removing a predetermined number of sacrificial insulating layers 110 and interlayer insulating layers 120 from an uppermost portion, and depositing an insulating material. The upper separation region 180 may extend downwardly of a region, in which the upper gate electrodes 130U of FIG. 1 are formed, in a Z direction.

By performing an etching process in a location corresponding to the channel structures CH of FIG. 1, a channel through-hole may be formed to penetrate through the stack structure GS. The channel through-hole may be filled to form channel structures CH.

Figure 11E:
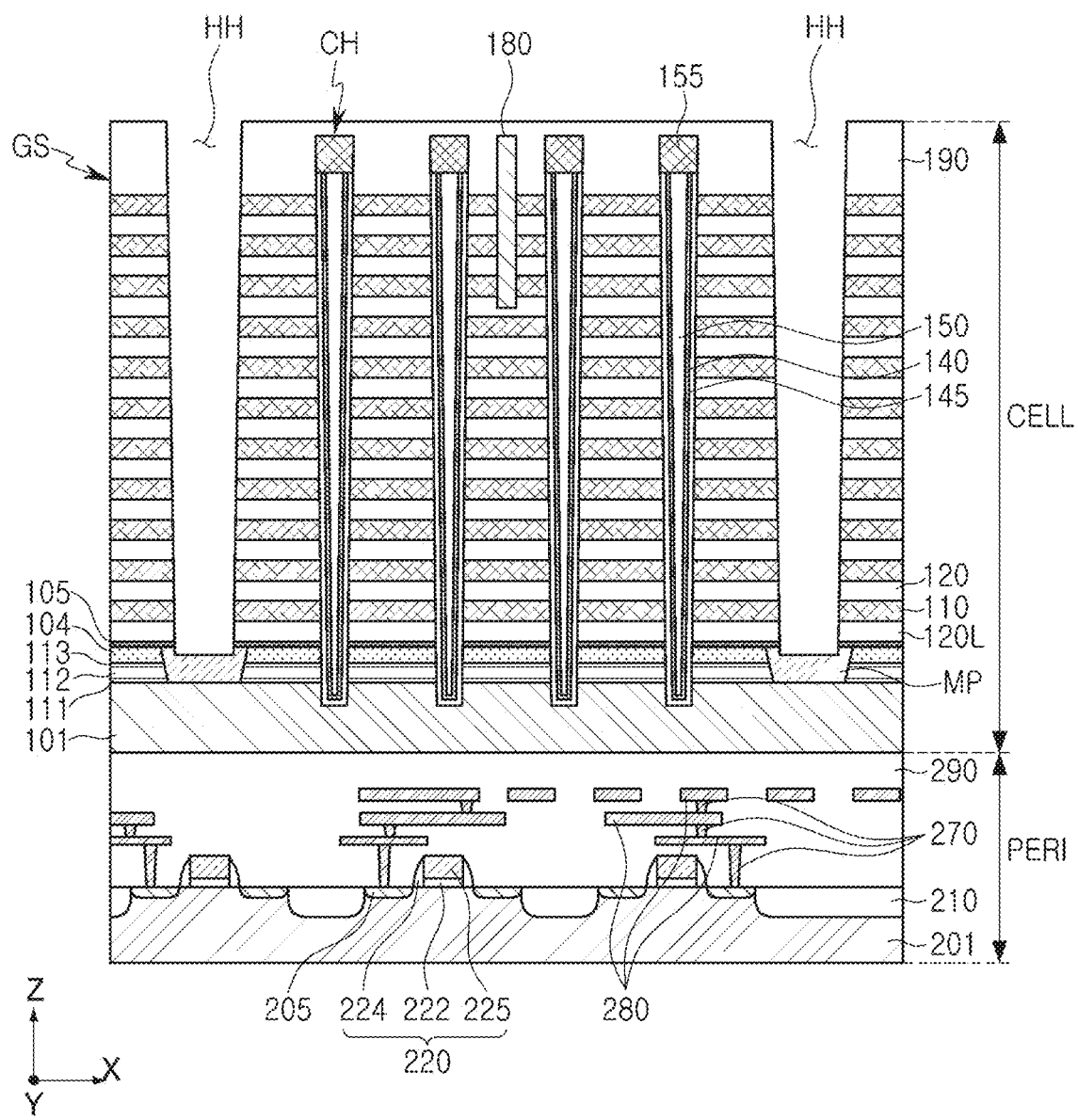
Figure 11F:
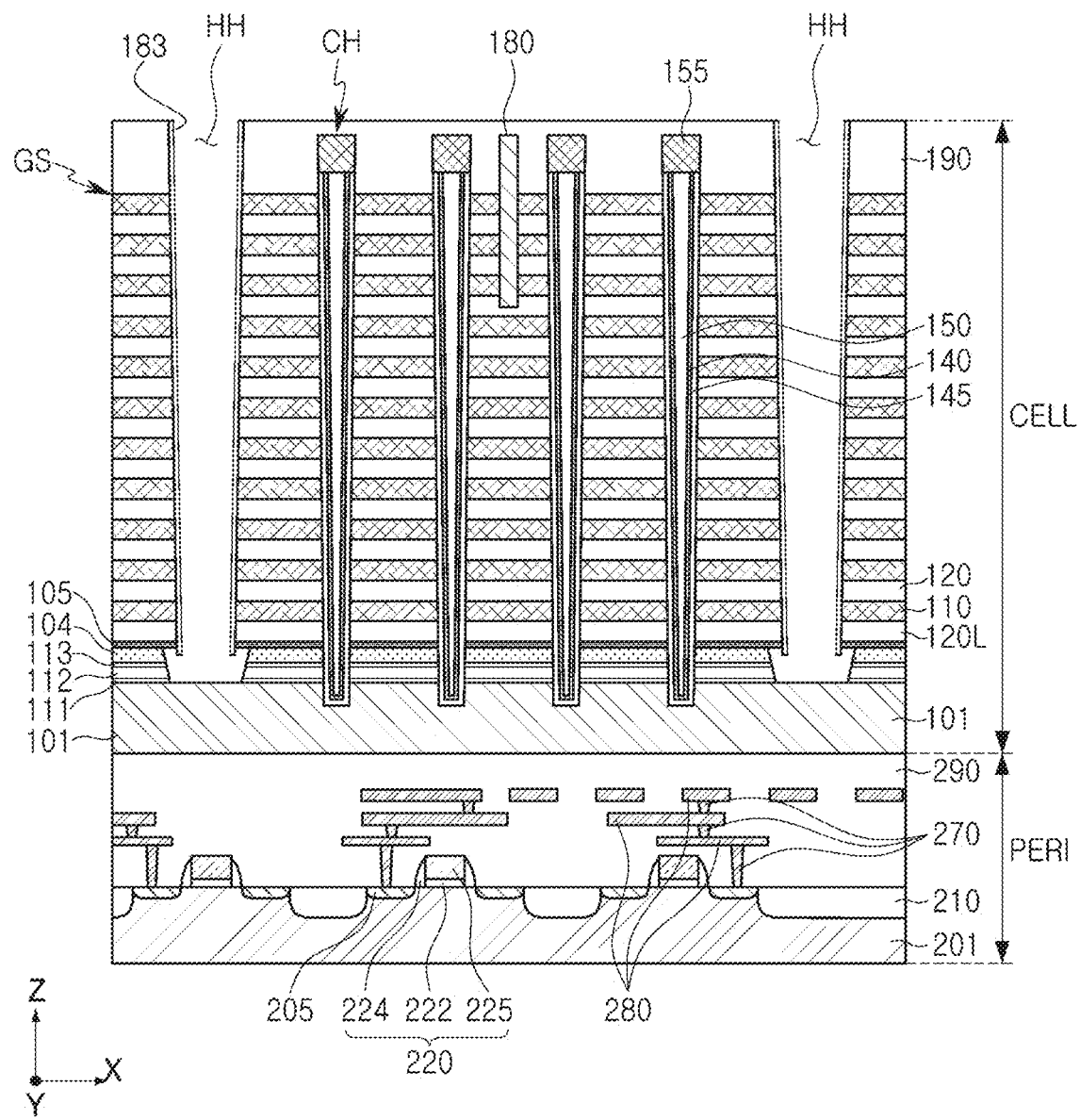

Referring to FIG. 11E, a through-hole HH may be formed in a region corresponding to the separation region SR of FIG. 1.

The through-hole HH may be formed by etching the stack structure GS in which the sacrificial insulating layers 110 and the interlayer insulating layers 120 are alternately stacked. The metal pad MP may serve as an etch-stop layer due to etch selectivity with respect to neighboring elements. Accordingly, even when the second horizontal conductive layer 104 formed in FIG. 11A does not have a great thickness, an etching process may be easily performed by the metal pad MP.

When an upper end of the metal pad MP is formed to have a width greater than a minimum width of a lower portion of the through-hole HH, a misalignment between the through-hole HH and the metal pad MP may be reduced in the etching process.

Since the height of the metal pad MP may be freely changed, the difficulty of an etching process of the through-hole HH may be reduced.

Referring to FIG. 11F, a sidewall spacer 183 may be formed on a sidewall of the through-holes HH, and then the metal pad MP may be removed.

While the sidewall spacer 183 is formed along the sidewall of the through-hole HH, an etch-back process may be performed to expose the metal pad MP. Due to an etch selectivity of the metal pad MP with respect to peripheral components, only a portion of the metal pad MP may be selectively removed from the exposed region.

Figure 11G:
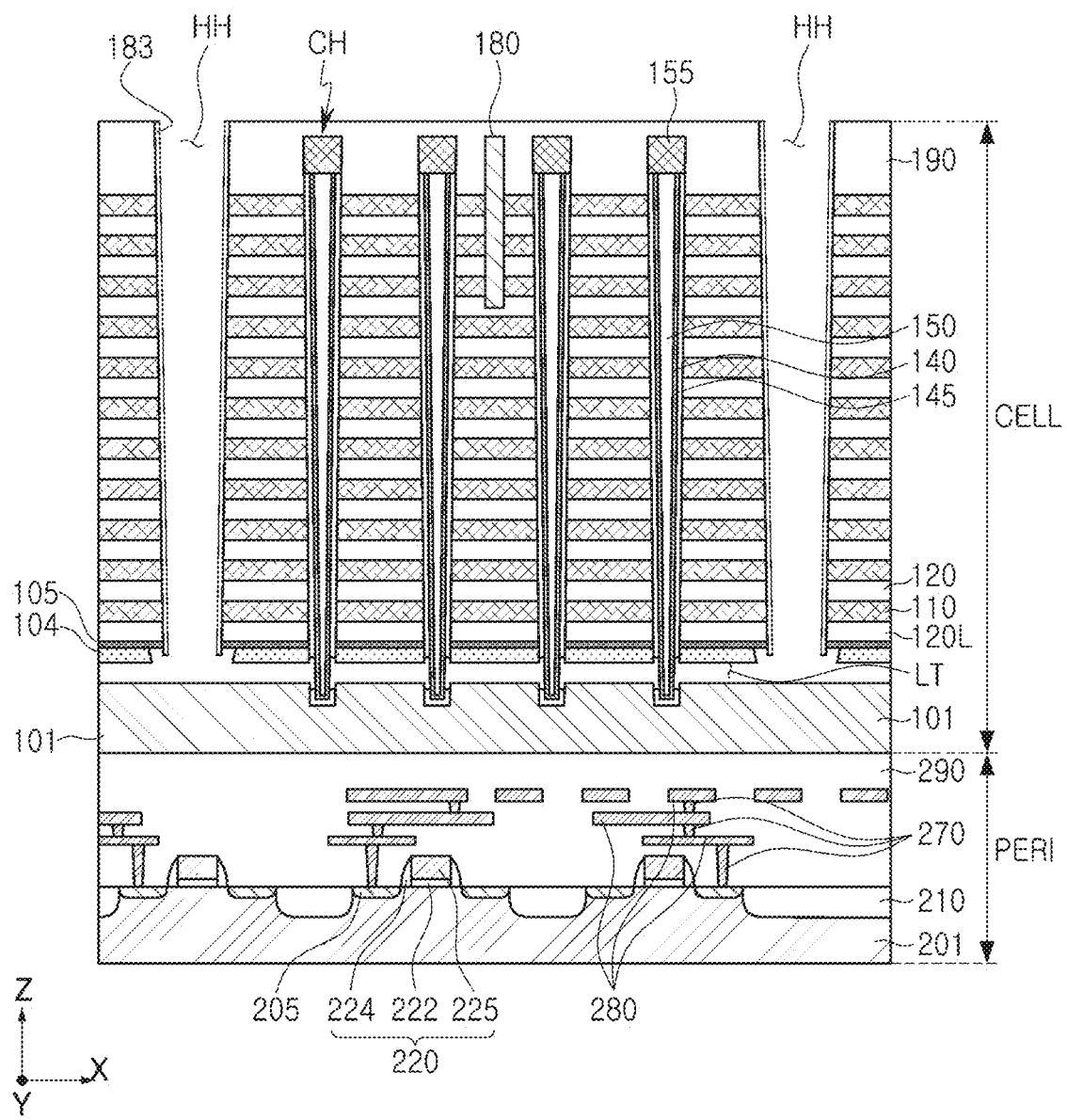

Referring to FIG. 11G, portions of the first to third sacrificial insulating layers 111, 112, and 113 and the gate dielectric layer 145 may be removed through an etching process to form a tunnel portion LT.

The metal pad MP may be removed to selectively remove the exposed second horizontal insulating layer 112, and then the first and third horizontal insulating layers 111 and 113 disposed thereabove and therebelow may be removed.

The first to third horizontal insulating layers 111, 112, and 113 may be removed by, for example, a wet etching process. A portion of the gate dielectric layer 145, exposed in the region in which the second horizontal insulating layer 112 is removed, may also be removed in the process of removing the first and third horizontal insulating layers 111 and 113. In the some example embodiments, since the second horizontal conductive layer 104 may not be formed to a great thickness, the difficulty of an etching process of removing a portion of the gate dielectric layer 145 may be reduced.

Since a region, in which the metal pad MP is removed, and the lowermost interlayer insulating layer 120L are not in contact with each other and the third horizontal conductive layer 105 is disposed between the region, in which the metal pad MP is removed, and the lowermost interlayer insulating layer 120L, the lowermost interlayer insulating layer 120L may not be etched in the process of removing the first to third sacrificial insulating layers 111, 112, and 113.

Figure 11H:
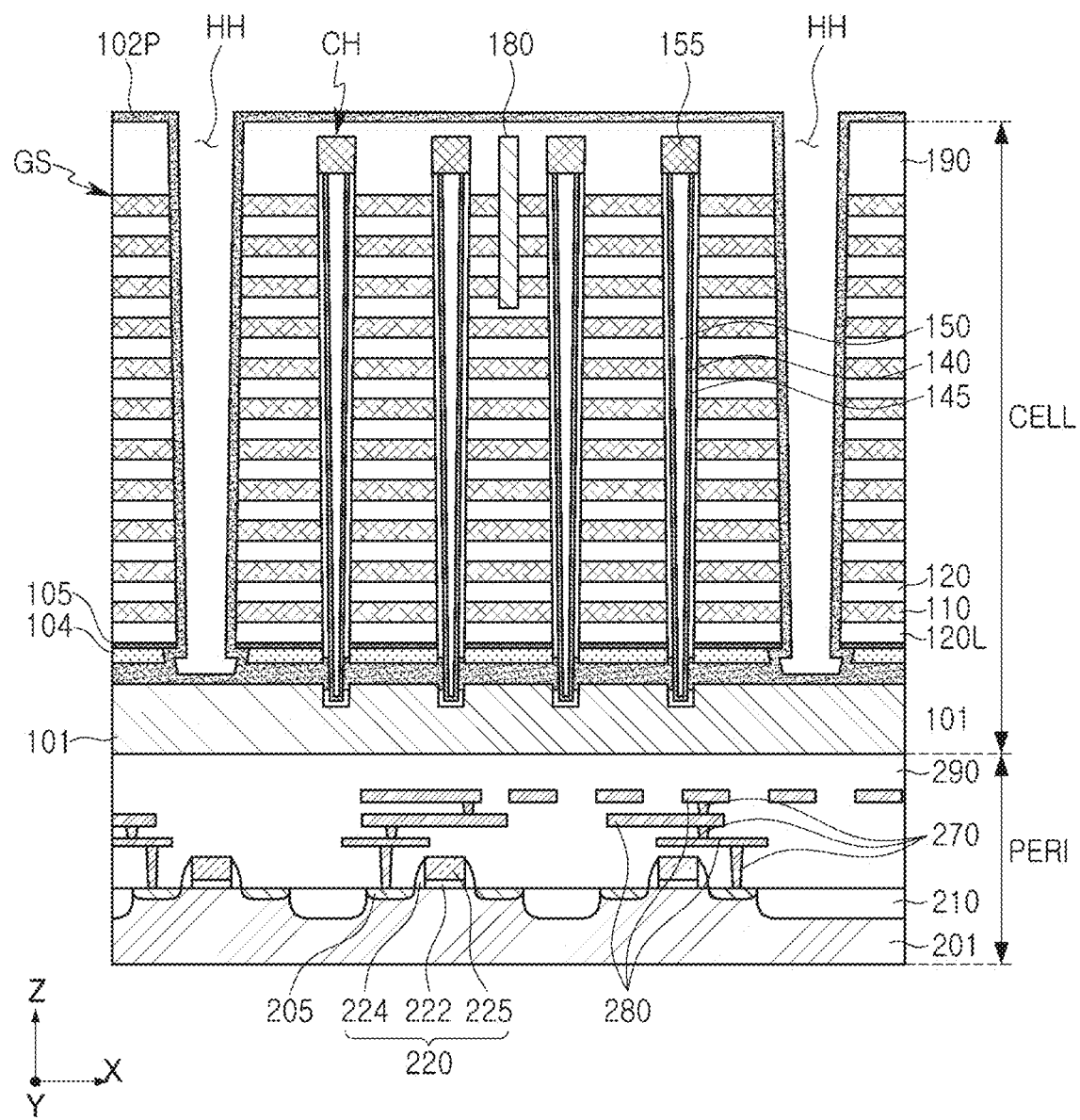

Referring to FIG. 11H, a conductive material may be deposited on the tunnel portion LT, in which the first to third horizontal insulating layers 111, 112, and 113 are removed, to form a preliminary first horizontal conductive layer 102P. The sidewall spacers 183 may not be distinguished from the preliminary first horizontal conductive layer 102P, and may be removed together in a process of forming a first horizontal conductive layer 102P to be described with reference to FIG. 11I.

Figure 11I:
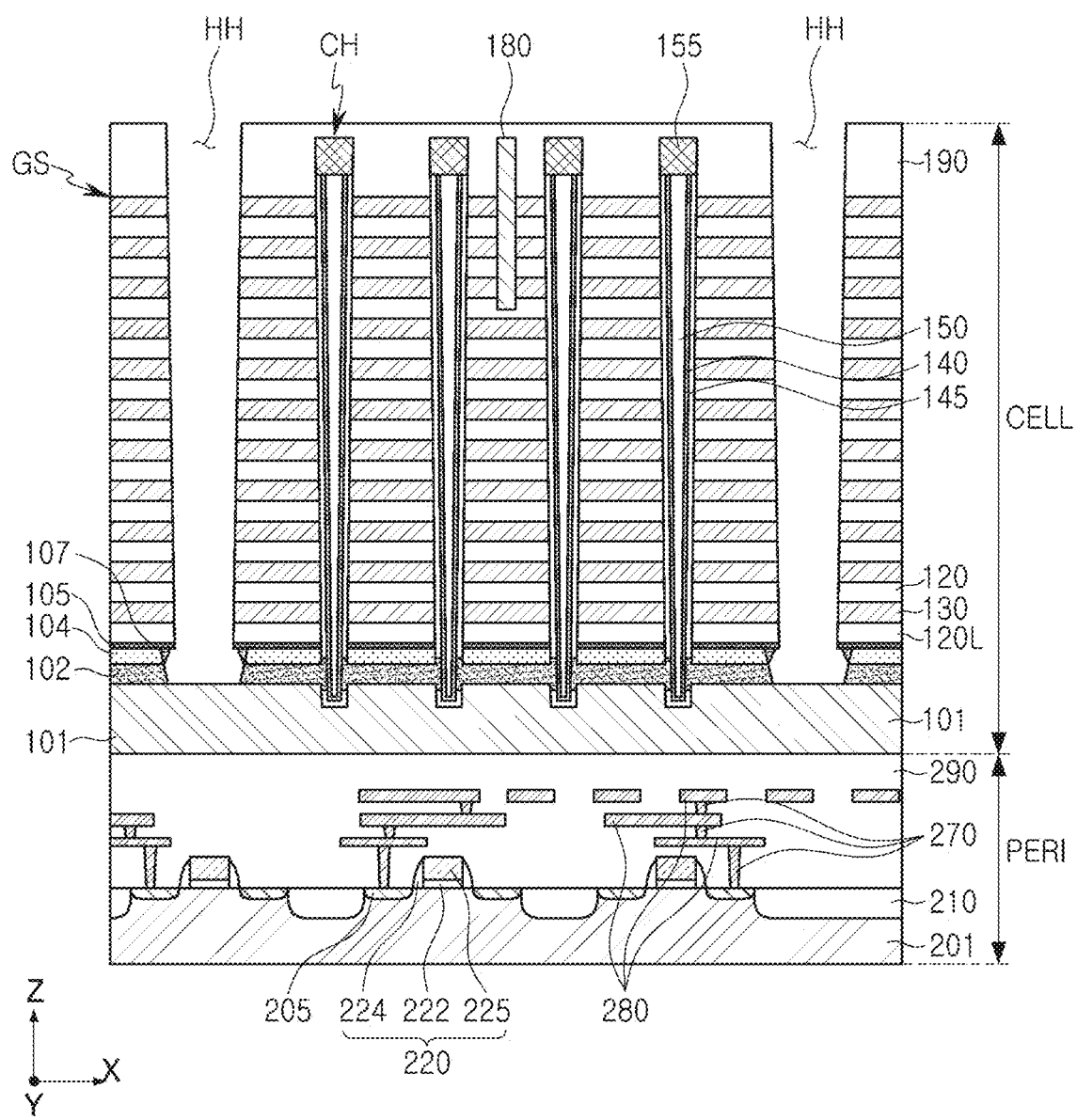

Referring to FIG. 11I, a portion of the preliminary first horizontal conductive layer 102P, disposed on a sidewall and a lower portion of the through-hole HH, may be removed to form a first horizontal conductive layer 102 and a first conductive pattern 107. Then, the sacrificial insulating layers 110 may be replaced with a conductive material to form gate electrodes 130.

The first horizontal conductive layer 102 may be formed to be partially connected to the channel layer 140 while filling the tunnel portion LT of FIG. 11H. The first conductive pattern 107 may be formed by allowing a portion of preliminary first horizontal conductive layer 102P to remain, and may constitute a pair of patterns on opposite sides based on a center of the through-hole HH.

The sacrificial insulating layers 110 may be selectively removed with respect to the interlayer insulating layers 120 and the first to third horizontal conductive layers 102, 104, and 105 using an etching process. Accordingly, a plurality of openings may be formed between the interlayer insulating layers 120. A conductive material, forming the gate electrodes 130, may fill the openings. The conductive material may include a metal, polycrystalline silicon, and/or a metal silicide material.

Returning to FIG. 1, the through-hole HH region may be filled with an insulating material to form a separation structure SR including the separation insulating layer 185.

The separation structure SR may include a second portion SR2, corresponding to a region removed after the metal pad MP is formed, and a first portion SR1 corresponding to a region in which an etching process is performed on the metal pad MP to form the through-hole HH.

FIGS. 12A to 12F are schematic views illustrating a method of manufacturing a semiconductor device according to example embodiments.

Figure 12A:
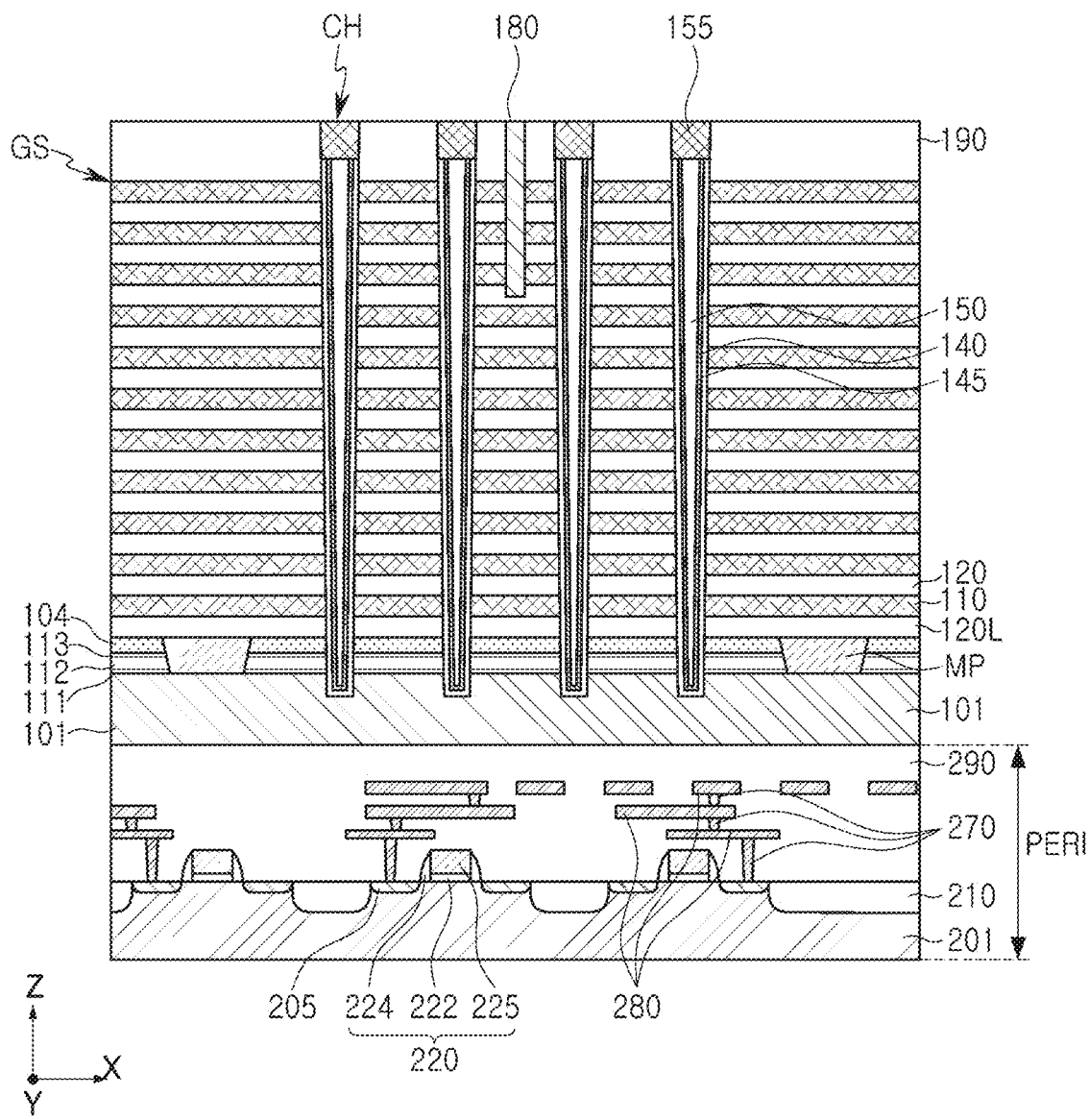
FIGS. 12A to 12F are schematic views illustrating a method of manufacturing a semiconductor device according to example embodiments.

Referring to FIG. 12A, sacrificial insulating layers 110 and interlayer insulating layers 120 may be alternately stacked on the second horizontal conductive layer 104 and the metal pad MP of FIG. 11B to form a stack structure GS, and then the upper separation region 180 and the channel structures CH may be formed to penetrate through the stack structure GS. The stack structure GS, the upper separation region 180, and the channel structures CH may be formed by the same method as described in FIG. 11D. A lowermost interlayer insulating layer 120L may be formed to be in contact with the metal pad MP.

Figure 12B:
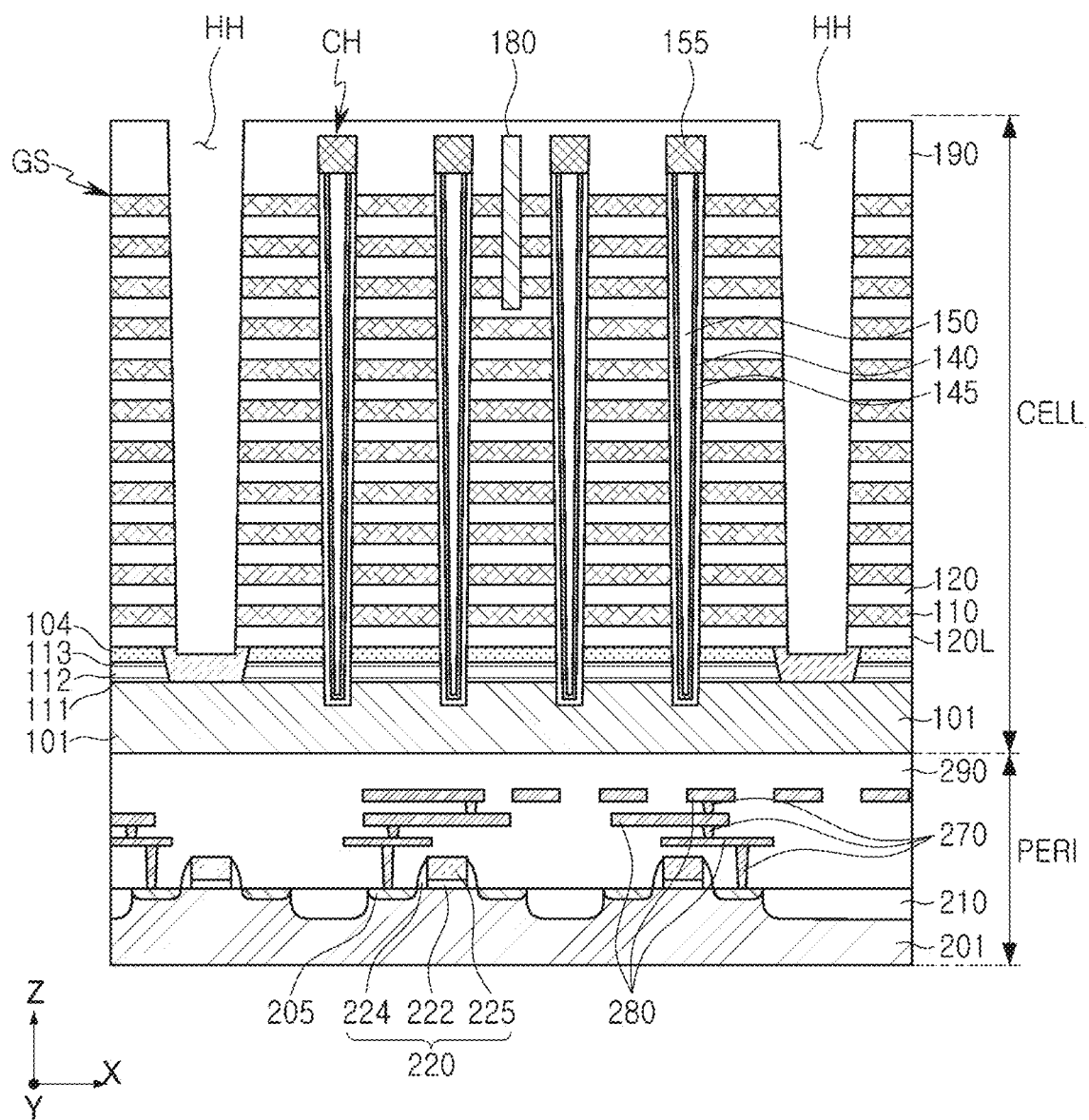

Referring to FIG. 12B, a through-hole HH may be formed in a region corresponding to the separation structure SR of FIG. 3. The manufacturing method described with reference to FIG. 11E may be equally applied.

Figure 12C:
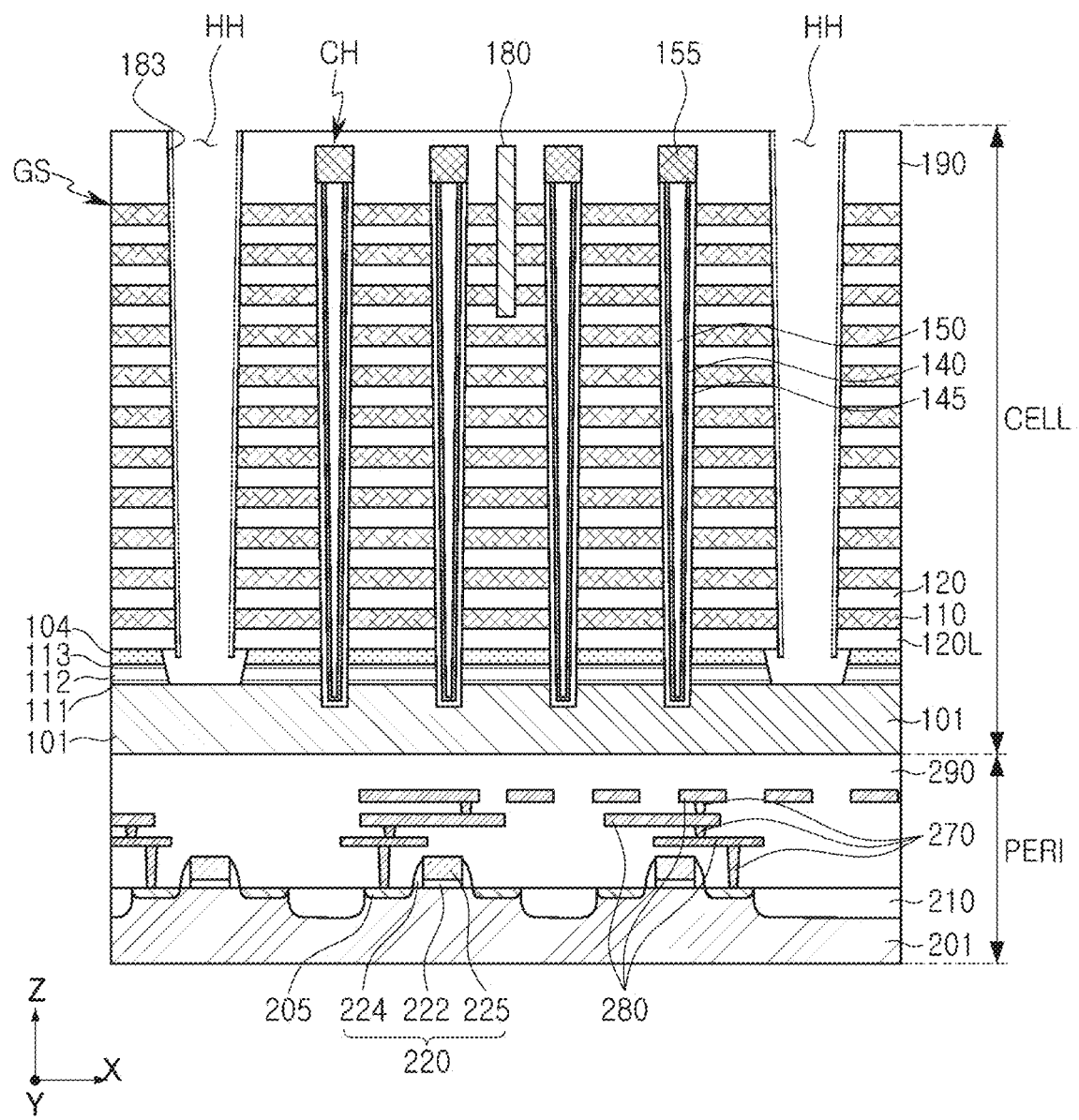

Referring to FIG. 12C, a sidewall spacer 183 may be formed on a sidewall of the through-hole HH, and then the metal pad MP may be removed. The manufacturing method described with reference to FIG. 11F may be equally applied.

Figure 12D:
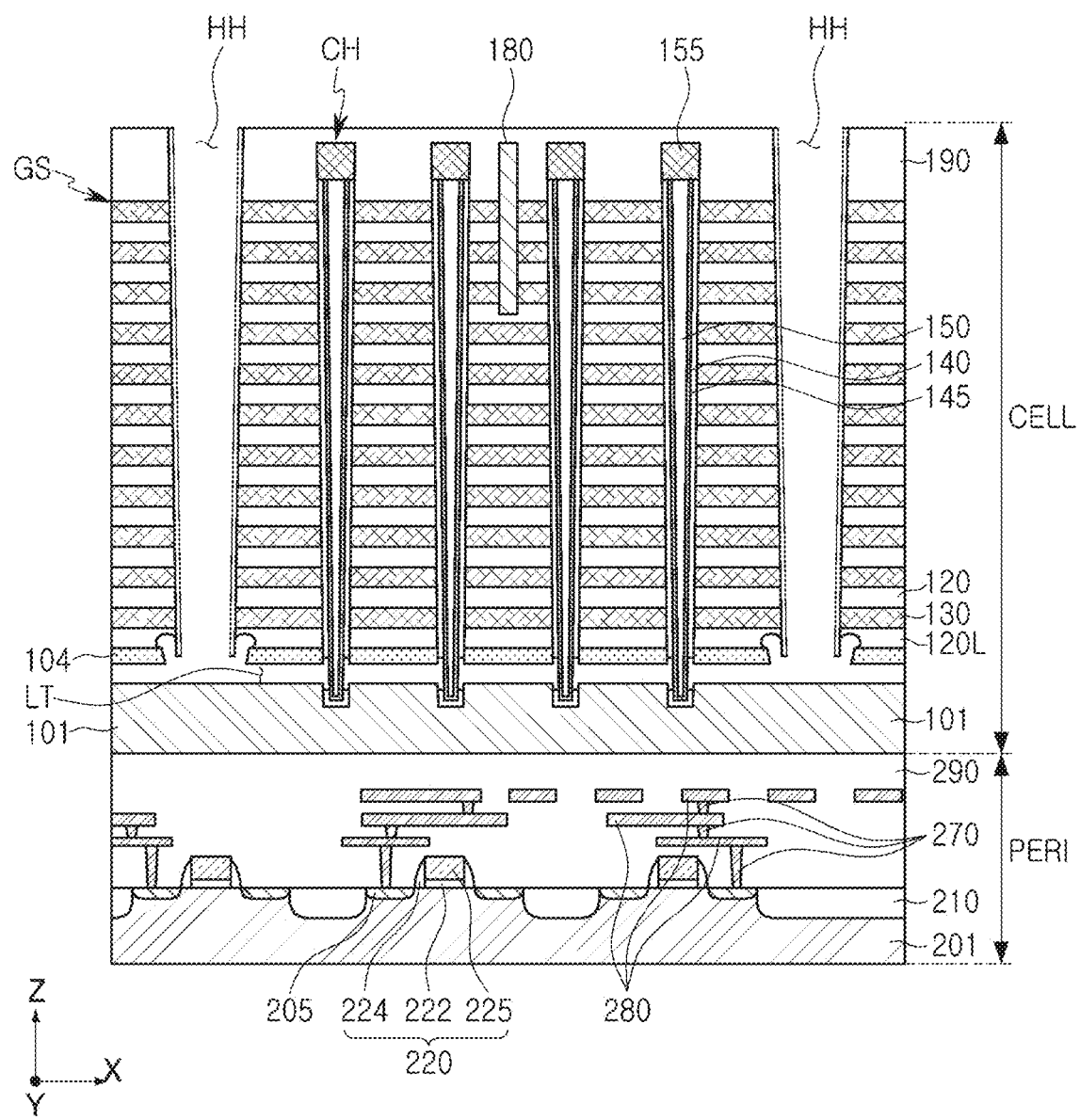

Referring to FIG. 12D, portions of the first to third sacrificial insulating layers 111, 112, and 113 and the gate dielectric layer 145 may be removed through an etching process to form a tunnel portion LT. The manufacturing method described with reference to FIG. 11G may be equally applied.

In addition to the first to third horizontal insulating layers 111, 112, and 113, the lowermost interlayer insulating layer 120L disposed on the second horizontal conductive layer 104 may be exposed when the tunnel portion LT is formed. Thus, a portion of the lowermost interlayer insulating layer 120L may be removed.

Figure 12E:
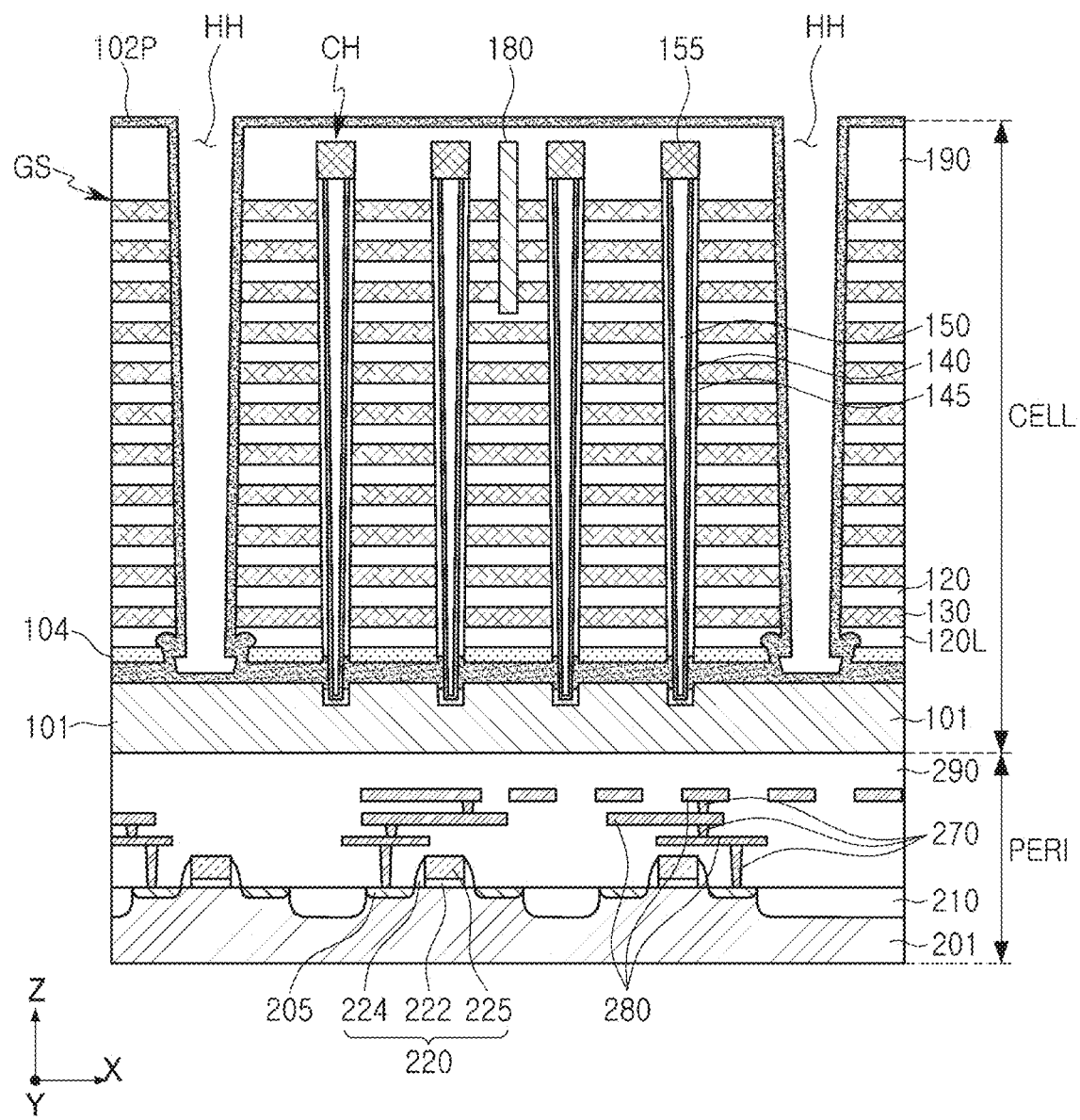

Referring to FIG. 12E, a conductive material may be deposited on the tunnel portion LT, in which the first to third horizontal insulating layers 111, 112, and 113 are removed, to form a preliminary first horizontal conductive layer 102P. The preliminary first horizontal conductive layer 102P may be deposited even on the region in which a portion of the lowermost interlayer insulating layer 120L described in FIG. 12D is removed.

Figure 12F:
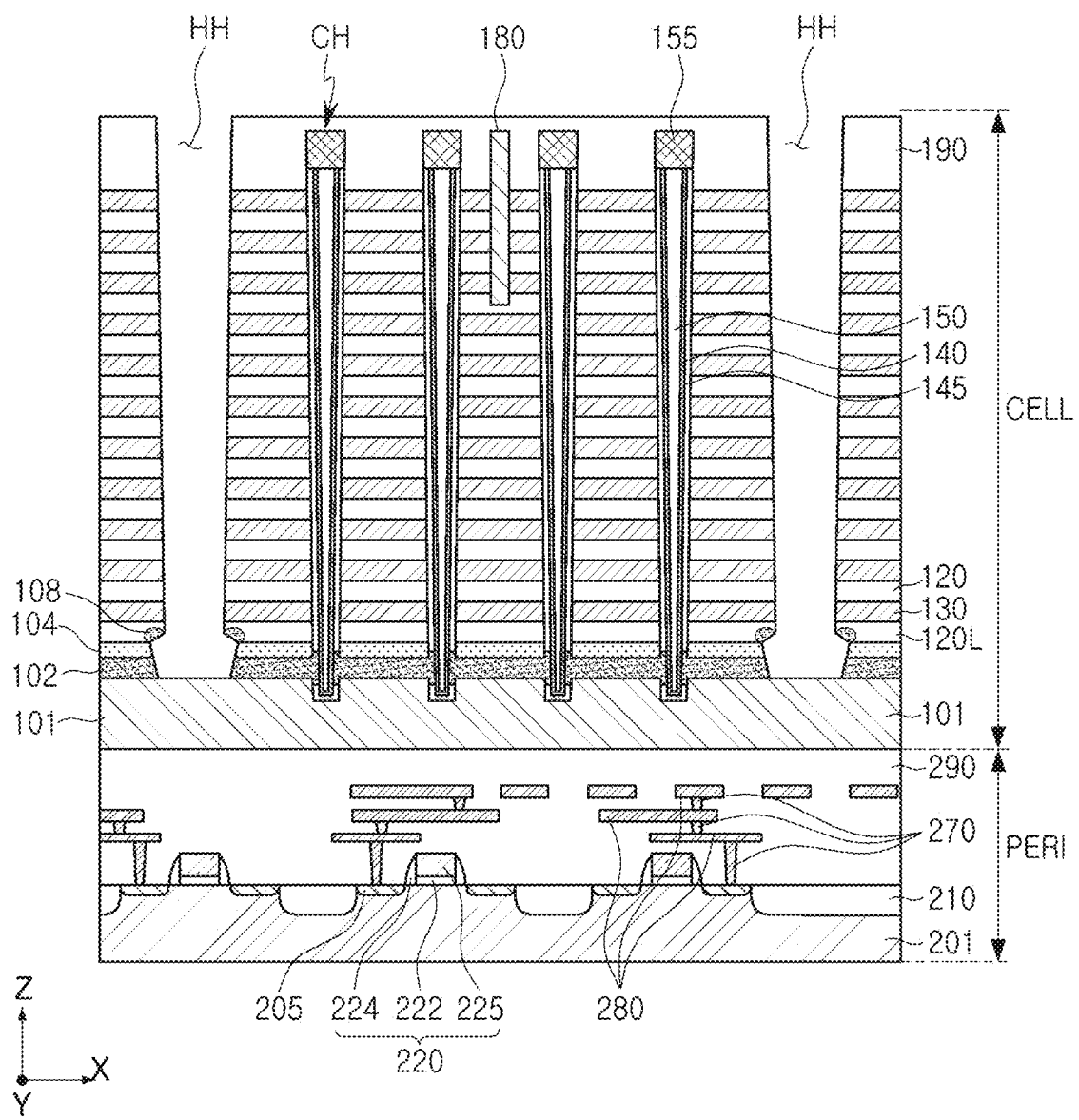

Referring to FIG. 12F, a portion of the preliminary first horizontal conductive layer 102P, disposed on the sidewall and the lower portion of the through-hole HH, may be removed to form a first horizontal conductive layer 102 and a second conductive pattern 108. Then, the sacrificial insulating layers 110 may be replaced with a conductive material to form gate electrodes 130.

The first horizontal conductive layer 102P may be formed to be partially connected to the channel layer 140 while filling the tunnel portion LT of FIG. 12D. The second conductive pattern 108 may be formed by allowing a portion of the preliminary first horizontal conductive layer 102P to remain, and may constitute a pair of patterns on opposite sides based on a center of the through-hole HH. The second conductive pattern 108 may be formed by allowing a portion of the preliminary first horizontal conductive layer 120P adjacent to the lowermost interlayer insulating layer 120L to remain, and may be in contact with the lowermost interlayer insulating layer 120L.

The manufacturing method described with reference to FIG. 11I may be equally applied to the gate electrodes 130.

Returning to FIG. 3, a region of the through-hole HH may be filled with an insulating material to form a separation structure SR including the separation insulating layer 185.

The separation structure SR may include a second portion SR2, corresponding to a region removed after the metal pad MP is formed, and a first portion SR1 corresponding to a region in which an etching process is performed on the metal pad MP to form the through-hole HH.

Figure 13:
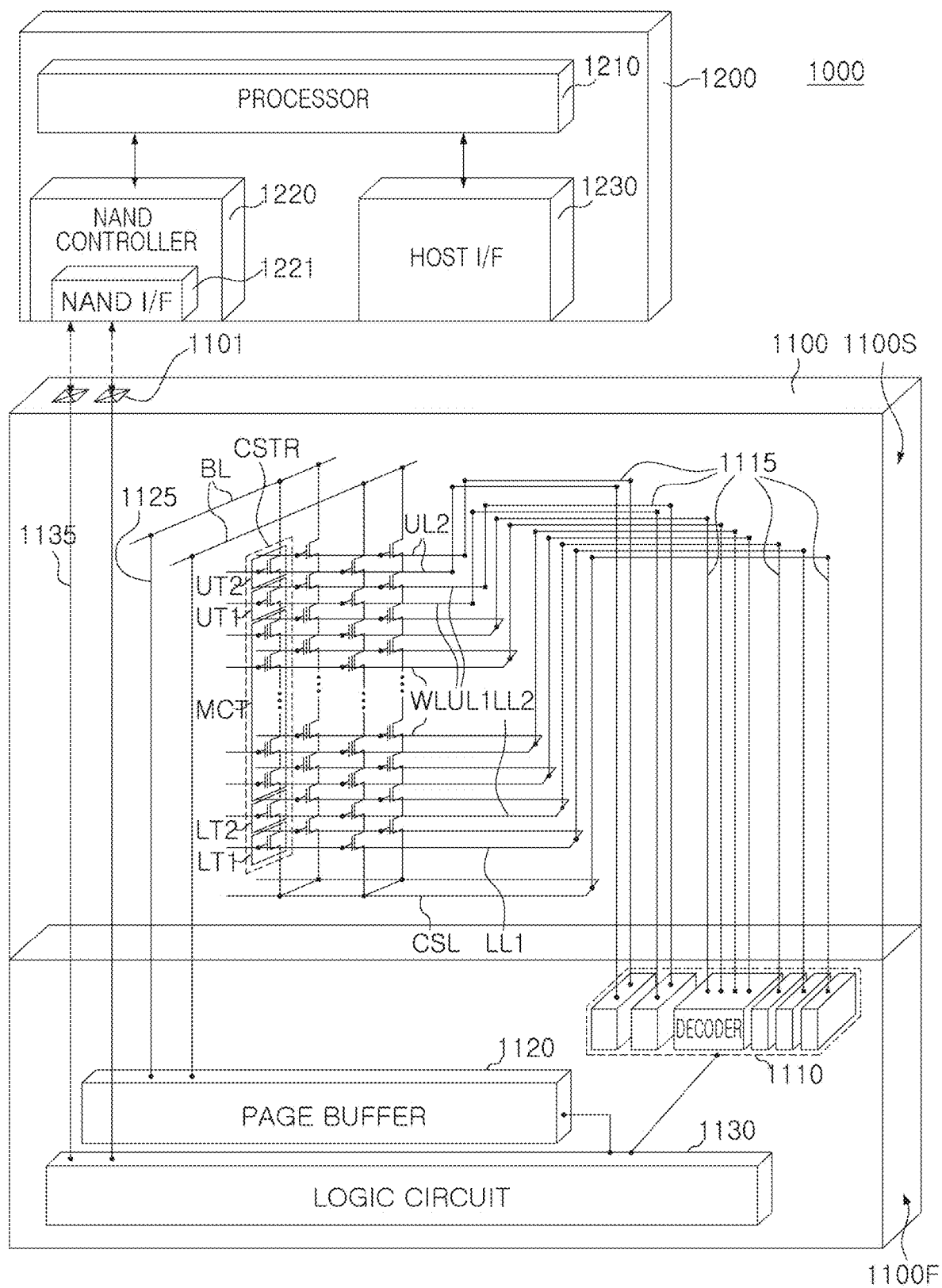
FIG. 13 is a schematic view of a data storage system including a semiconductor device according to example embodiments.

FIG. 13 is a schematic view of a data storage system including a semiconductor device according to example embodiments.

Referring to FIG. 13, a data storage system 1000 according to some example embodiments may include a semiconductor device 1100 and a controller 1200 electrically connected to the semiconductor device 1100. The data storage system 1000 may be a storage device including one or more semiconductor devices 1100, and/or an electronic device including a storage device. For example, the data storage system 1000 may be a solid state drive (SSD) device including one or more semiconductor devices 1100, a universal serial bus (USB), a computing system, a medical device, and/or a communications device.

The semiconductor device 1100 may be a nonvolatile memory device, for example, a NAND flash memory device described above with reference to FIGS. 1 to 10. The semiconductor device 1100 may include a first structure 1100F and a second structure 1100S on the first structure 1100F. In example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bitline BL, a common source line CSL, wordlines WL, first and second upper gate lines UL1 and UL2, first and second low gate lines LL1 and LL2, and memory cell strings CSTR between the bitline BL and the common source line CSL.

In the second structure 1100s, each of the memory cell strings CSTR may include lower transistors LT1 and LT2 adjacent to the common source line CSL, upper transistors UT1 and UT2 adjacent to the bitline BL, and a plurality of memory cell transistors MCT disposed between the lower transistors LT1 and LT2 and upper transistors UT1 and UT2. The number of lower transistors LT1 and LT2 and the number of upper transistors UT1 and UT2 may be changed in various ways according to example embodiments.

In example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The wordlines WL may be gate electrodes of the memory cell transistors MCT, respectively. The upper gate lines UL1 and UL2 may be gate electrodes of the upper transistors UT1 and UT2, respectively.

The common source line CSL, the first and second gate lower lines LL1 and LL2, the wordlines WL, and the first and second gate upper lines UL1 and UL2 may be electrically connected to the decoder circuit 1110 through first connection interconnections 1115 extending to the second structure 1100S in the first structure 1100F. The bitlines BL may be electrically connected to the page buffer 1120 through second interconnection lines 1125 extending from the first structure 1100F to the second structure 1100S.

In the first structure 1100F, the decoder circuit 1110 and the page buffer 1120 may perform a control operation on at least one selected memory cell transistor, among the plurality of memory cell transistors MCT. The decoder circuit 1110 and the page buffer 1120 may be controlled by the logic circuit 1130. The semiconductor device 1000 may communicate with the controller 1200 through an input/output pad 1101 electrically connected to the logic circuit 1130. The input/output pad 1101 may be electrically connected to the logic circuit 1130 through an input/output connection interconnection 1135 extending from the first structure 1100F to the second structure 1100S.

The controller 1200 may include a processor 1210, a NAND controller 1220, and a host interface 1230. According to some example embodiments, the electronic system 1000 may include a plurality of semiconductor devices 1100. In this case, the controller 1200 may control the plurality of semiconductor devices 1000.

The processor 1210 may control all operations of the electronic system 1000 including the controller 1200. The processor 1210 may operate based on predetermined firmware, and may control the NAND controller 1220 to access the semiconductor device 1100. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, and the like, may be transmitted through the NAND interface 1221. The host interface 1230 may provide a communications function between the electronic system 1000 and an external host. When a control command is received from the external host through the host interface 1230, the processor 1210 may control the semiconductor device 1100 in response to the control command.

Figure 14:
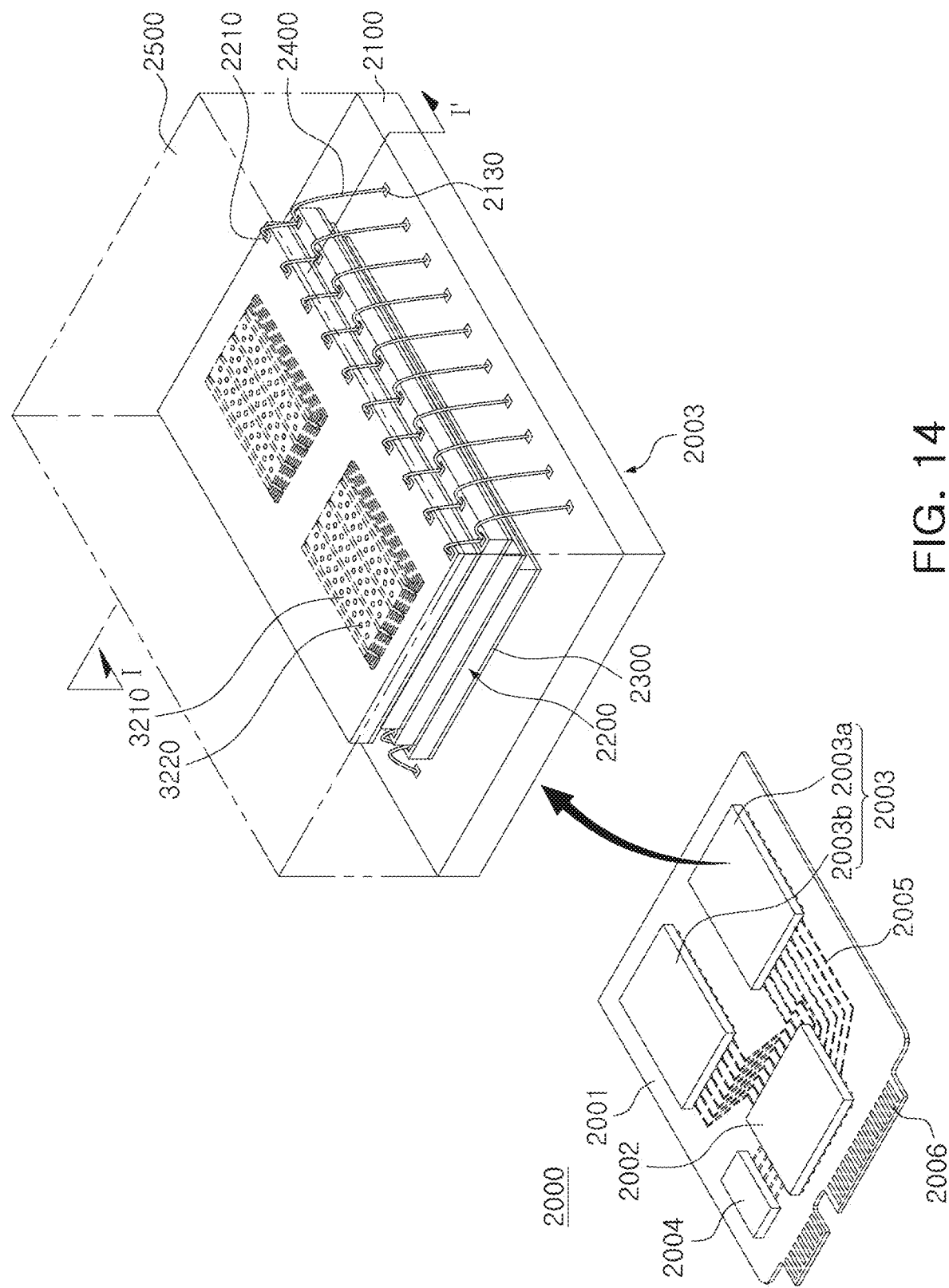
FIG. 14 is a schematic perspective view of a data storage system including a semiconductor device according to some example embodiments.

FIG. 14 is a schematic perspective view of a data storage system including a semiconductor device according to some example embodiments.

Referring to FIG. 14, an electronic system 2000 according to example embodiments includes a main substrate 2001, a controller 2002 mounted on the main substrate 2001, and one or more semiconductor packages 2003, and DRAM 2004. The semiconductor package 2003 and the DRAM 2004 may be connected to the controller 2002 by interconnection patterns 2005 formed on the main substrate 2001.

The main board 2001 may include a connector 2006 including a plurality of pins connected to an external host. The number and arrangement of the plurality of pins in the connector 2006 may vary depending on a communications interface between the electronic system 2000 and the external host. In example embodiments, the electronic system may communicate with the external host according to one of interfaces such as a universal serial bus (USB), a peripheral component interconnect express (PCI-Express), a serial advanced technology attachment (SATA), M-PHY for a universal flash storage (UFS), and the like. In example embodiments, the electronic system 2000 may operate using power supplied from an external host through the connector 2006. The electronic system 2000 may further include a power management integrated circuit (PMIC) distributing power, supplied from the external host, to the controller 2002 and the semiconductor package 2003.

The controller 2002 may write data to the semiconductor package 2003, or may read data from the semiconductor package 2003. The controller 2002 may improve an operation speed of the electronic system 2000.

The DRAM 2004 may be a buffer memory for reducing a difference in speeds between the semiconductor package 2003, a data storage space, and the external host. The DRAM 2004, included in the electronic system 2000, may also operate as a type of cache memory, and may provide a space for temporarily storing data in a control operation on the semiconductor packages 2003. When the DRAM 2004 is included in the electronic system 2000, the controller 2002 may further include a DRAM controller for controlling the DRAM 2004, in addition to a NAND controller for controlling the semiconductor packages 2003.

The semiconductor package 2003 may include first and second semiconductor packages 2003a and 2003b disposed to be spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300, respectively disposed on lower surfaces of the semiconductor chips 2200, a connection structure 2400 electrically connecting the semiconductor chips 2200 and the package substrate 2100 to each other, and a molding layer 2500 covering the semiconductor chips 2200 and the connection structure 2400 on the package substrate 2100.

The package substrate 2100 may be a printed circuit board (PCB) including upper package pads 2130. Each of the semiconductor chips 2200 may include an input/output pad 2210. The input/output pad 2210 may correspond to the input/output pad 1101 of FIG. 13. Each of the semiconductor chips 2200 may include first and second stack structures ST1 and ST2 and channel structures CH. Each of the semiconductor chips 2200 may include the semiconductor device described with reference to FIGS. 1 to 10.

In example embodiments, the connection structure 2400 may be a bonding wire electrically connecting the input/output pad 2210 and the package upper pads 2130 to each other. Accordingly, in each of the first and second semiconductor packages 2003a and 2003b, the semiconductor chips 2200 may be electrically connected to each other using wire bonding, and may be electrically connected to the upper package pads 2130 of the package substrate 2100. According to example embodiments, in each of the first and second semiconductor packages 2003a and 2003b, the semiconductor chips 2200 may be electrically connected to each other by a connection structure having a through-silicon via (TSV), rather than the connection structure 2400 using the wire bonding.

In example embodiments, the controller 2002 and the semiconductor chips 2200 may be included in a single package. In example embodiments, the controller 2002 and the semiconductor chips 2200 are mounted on an additional interposer substrate different from the main substrate 2001, and the controller 2002 and the semiconductor chips 2200 may be connected to each other by a wiring formed in the interposer substrate.

Figure 15:
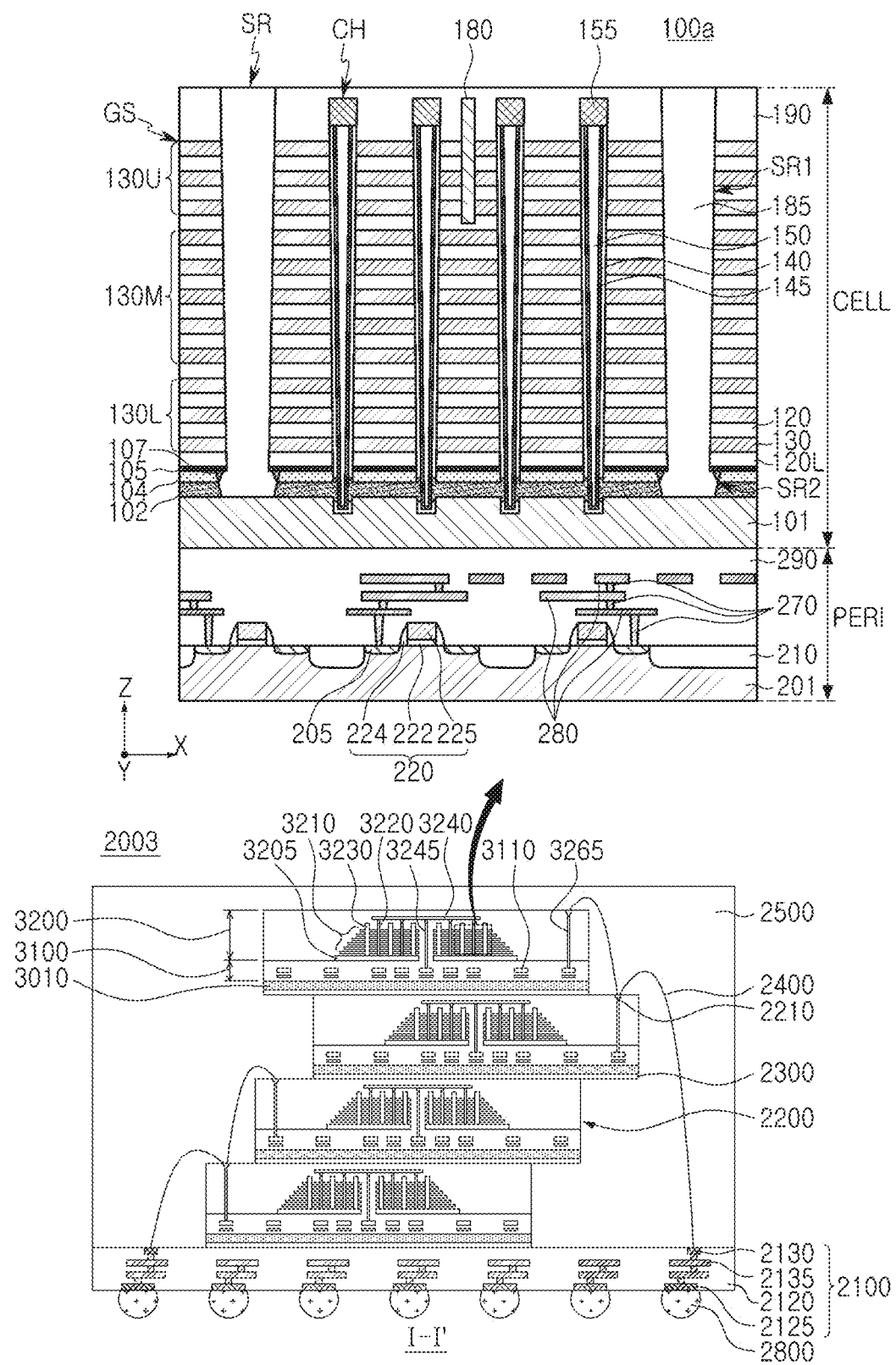
FIG. 15 is a schematic cross-sectional view of a semiconductor package according to some example embodiments.

FIG. 15 is a schematic cross-sectional view of a semiconductor package according to some example embodiments. FIG. 15 illustrates some example embodiments of the semiconductor package 2003 of FIG. 14, and conceptually illustrates a region taken along line I-I' of the semiconductor package 2003 of FIG. 14.

Referring to FIG. 15, in a semiconductor package 2003, a package substrate 2100 may be a printed circuit board (PCB). The package substrate 2100 may include a package substrate body portion 2120, upper package pads 2130 disposed on an upper surface of the package substrate body portion 2120, lower package pads 2125 disposed on a lower surface of the package substrate body portion 2120 or exposed through the package substrate body portion 2120, and internal wirings 2135 electrically connecting the upper package pads 2130 and the lower package pads 2125 to each other within the package substrate body portion 2120. The upper package pads 2130 may be electrically connected to a connection structures 2400. The lower package pads 2125 may be connected to wiring patterns 2005 of the main substrate 2010 of the electronic system 2000 through conductive connection portions 2800, as illustrated in FIG. 14.

Each of the semiconductor chips 2200 may include a semiconductor substrate 3010 and a first structure 3100 and a second structure 3200 sequentially stacked on the semiconductor substrate 3010. The first structure 3100 may include a peripheral circuit region including peripheral interconnections 3110. The second structure 3200 may include a common source line 3205, a stack structure 3210 on the common source line 3205, channel structures 3220 and separation structures 3230 penetrating through the stack structure 3210, bitlines 3240 electrically connected to the channel structures 3220, and gate interconnection lines 3235 electrically connected to wordlines (WL of FIG. 13) of the stack structure 3210. Each of the first structure 3100, the second structure 3200, and the semiconductor chips 2200 may further include a first conductive pattern 107 protruding outwardly of the separation structure SR from a side surface of the separation structure SR, as illustrated in the enlarged view. In addition, in each of the first structure 3100, the second structure 3200, and the semiconductor chips 2200, the separation structure SR may include a first portion SR1, having a continuously decreased width, and a second portion SR2 having a width discontinuously changed below the first portion SR1.

Each of the semiconductor chips 2200 may include a through-interconnection 3245 electrically connected to peripheral interconnections 3110 of the first structure 3100 and extending inwardly of the second structure 3200. The through-interconnection 3245 may penetrate through the stack structure 3210, and may be further disposed outside the stack structure 3210. Each of the semiconductor chips 2200 may further include an input/output interconnection line 3265, electrically connected to the peripheral interconnections 3110 of the first structure 3100 and extending inwardly of the second structure 3200, and an input/output pad 2210 electrically connected to the input/output interconnection line 3265.

The semiconductor chips 2200 of FIG. 15 may be electrically connected to each other by connection structures 2400 in the form of bonding wires. However, in example embodiments, semiconductor chips in a single semiconductor package such as the semiconductor chips 2200 of FIG. 15 may be electrically connected to each other by a connection structure including a through electrode TSV.

As described above, before a wordline cut etching process is performed, a metal pad used as an etch-stop layer may be performed below a wordline cut to reduce difficulty of an etching process with an increase in the number of semiconductor devices to be stacked. Accordingly, a semiconductor device having reliability, improved through the metal pad below the wordline cut, and a data storage system including the semiconductor device may be provided.

While example embodiments have been shown and described above, it will be apparent to those skilled in the art that modifications and variations could be made without departing from the scope of the present inventive concept as defined by the appended claims.

What is claimed is:

1. A semiconductor device comprising:
a peripheral circuit structure including a first substrate and circuit elements on the first substrate;
a second substrate on the peripheral circuit structure;
a first horizontal conductive layer on the second substrate;
a second horizontal conductive layer on the first horizontal conductive layer;
a stack structure including a plurality of gate electrodes, stacked to be spaced apart from each other in a direction perpendicular to an upper surface of the second horizontal conductive layer, and a plurality of interlayer insulating layers stacked alternately with the plurality of gate electrodes;
a channel structure including a channel layer and penetrating through the first horizontal conductive layer, the second horizontal conductive layer, and the stack structure; and
a separation insulating layer penetrating through the first horizontal conductive layer, the second horizontal conductive layer, and the stack structure and extending in a first direction, the separation insulating layer including a first portion having a continuously decreasing width, and a second portion penetrating through the first and second horizontal conductive layers and having a width greater than a minimum width of the first portion, a sidewall of the second portion having a first slope from a bottom surface, the first slope intersecting a second slope which extends to a level of the first portion and the second portion intersecting, an intersection of the first slope and the second slope being less than 180 degrees.

2. The semiconductor device of claim 1, wherein at least a portion of the second portion of the separation insulating layer is on a higher level than a lowermost surface of the second horizontal conductive layer.

3. The semiconductor device of claim 1, further comprising:
a third horizontal conductive layer between the second horizontal conductive layer and the stack structure.

4. The semiconductor device of claim 3, wherein a side surface of the third horizontal conductive layer is farther from a central axis of the separation insulating layer than a side surface of the second horizontal conductive layer.

5. The semiconductor device of claim 3, further comprising:
a first conductive pattern in contact with a side surface of the second horizontal conductive layer, a lower surface of the third horizontal conductive layer, and the separation insulating layer.

6. The semiconductor device of claim 5, wherein the first conductive pattern comprises a pair of patterns symmetrical with respect to a central axis of the separation insulating layer.

7. The semiconductor device of claim 1, wherein at least a portion of the second portion of the separation insulating layer is on a higher level of a lower surface of a lowermost interlayer insulating layer of the plurality of interlayer insulating layers.

8. The semiconductor device of claim 7, further comprising:
a second conductive pattern protruding in a direction of the lowermost interlayer insulating layer of the plurality of interlayer insulating layers, from a side surface of the separation insulating layer on a boundary between the first portion and the second portion, and being in contact with the lowermost interlayer insulating layer of the plurality of interlayer insulating layers.

9. The semiconductor device of claim 1, wherein the second portion of the separation insulating layer includes a region, having a width which increases in a direction toward the second substrate, and a region having a width which decreases in a direction toward the second substrate.

10. The semiconductor device of claim 1, wherein a lowermost surface of the separation insulating layer is on a higher level than a lowermost surface of the channel structure.

11. The semiconductor device of claim 1, wherein a lowermost surface of the separation insulating layer is on a lower level than a lower surface of the first horizontal conductive layer.

12. The semiconductor device of claim 11, wherein the lowermost surface of the separation insulating layer is on a lower level than a lowermost surface of the channel structure.

13. The semiconductor device of claim 11, wherein the separation insulating layer penetrates through the second substrate.

14. The semiconductor device of claim 1, wherein the first horizontal conductive layer includes a horizontal portion, between the second substrate and the second horizontal conductive layer, and a vertical portion connected to the channel layer on a periphery of the channel layer.

15. A semiconductor device comprising:
a substrate;
a horizontal conductive layer on the substrate;
a support layer on the horizontal conductive layer;
a stack structure including a plurality of gate electrodes, stacked to be spaced apart from each other in a direction perpendicular to an upper surface of the support layer, and a plurality of interlayer insulating layers stacked alternately with the plurality of gate electrodes;
a channel structure penetrating through the stack structure;
a separation structure penetrating through the horizontal conductive layer, the support layer, and the stack structure and extending in a first direction; and
a conductive pattern on a level between the horizontal conductive layer and a lowermost interlayer insulating layer of the plurality of interlayer insulating layers, and protruding outwardly of the separation structure from a side surface of the separation structure, the conductive pattern spaced apart from a lower surface of the horizontal conductive layer.

16. The semiconductor device of claim 15, wherein the conductive pattern is between the separation structure and the support layer and the same material as the horizontal conductive layer.

17. The semiconductor device of claim 15, wherein the conductive pattern is between the separation structure and the lowermost interlayer insulating layer of the plurality of interlayer insulating layers, and the same material as the horizontal conductive layer.

18. The semiconductor device of claim 15, wherein the separation structure includes a bent portion in a region adjacent to the support layer.

19. A data storage system comprising:
a semiconductor storage device including
a first substrate,
circuit elements on the first substrate,
a second substrate on the circuit elements,
a horizontal conductive layer on the second substrate,
a support layer on the horizontal conductive layer,
a stack structure including a plurality of gate electrodes, stacked to be spaced apart from each other in a direction perpendicular to an upper surface of the support layer, and a plurality of interlayer insulating layers, stacked alternately with the plurality of gate electrodes,
a channel structure penetrating through the stack structure,
a separation structure penetrating through the horizontal conductive layer, the support layer, and the stack structure and extending in a first direction,
a conductive pattern on a level between the horizontal conductive layer and a lowermost interlayer insulating layer of the plurality of interlayer insulating layers, and protruding outwardly of the separation structure from a side surface of the separation structure, the conductive pattern spaced apart from a lower surface of the horizontal conductive layer, and
an input/output pad electrically connected to the circuit element; and
a controller electrically connected to the semiconductor storage device through the input/output pad and configured to control the semiconductor storage device.

20. The data storage system of claim 19, wherein in the semiconductor storage device, the separation structure includes a first portion, having a continuously decreasing width, and a second portion penetrating through the horizontal conductive layer and the support layer and having a width smaller than a minimum width of the first portion.

* * * * *